(12) United States Patent
Sasagawa et al.

(10) Patent No.: US 9,824,898 B2
(45) Date of Patent: Nov. 21, 2017

(54) SEMICONDUCTOR DEVICE AND METHOD FOR MANUFACTURING THE SAME

(71) Applicant: SEMICONDUCTOR ENERGY LABORATORY CO., LTD., Atsugi-shi, Kanagawa-ken (JP)

(72) Inventors: Shinya Sasagawa, Kanagawa (JP); Motomu Kurata, Kanagawa (JP); Katsuaki Tochibayashi, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 15/429,547

(22) Filed: Feb. 10, 2017

(65) Prior Publication Data
US 2017/0154789 A1   Jun. 1, 2017

Related U.S. Application Data

(62) Division of application No. 14/476,921, filed on Sep. 4, 2014, now Pat. No. 9,570,622.

(30) Foreign Application Priority Data

Sep. 5, 2013 (JP) .................................. 2013-184096

(51) Int. Cl.
*H01L 29/40* (2006.01)
*H01L 21/44* (2006.01)
(Continued)

(52) U.S. Cl.
CPC ........ *H01L 21/44* (2013.01); *H01L 21/47573* (2013.01); *H01L 27/1218* (2013.01);
(Continued)

(58) Field of Classification Search
CPC .................. H01L 21/44; H01L 29/7869; H01L 29/66969; H01L 27/1218; H01L 29/401;
(Continued)

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   2226847 A   9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Bo Fan
(74) *Attorney, Agent, or Firm* — Nixon Peabody LLP; Jeffrey L. Costellia

(57) ABSTRACT

To provide a highly reliable semiconductor device using an oxide semiconductor. The semiconductor device includes a first electrode layer; a second electrode layer positioned over the first electrode layer and including a stacked-layer structure of a first conductive layer and a second conductive layer; and an oxide semiconductor film and an insulating film positioned between the first electrode layer and the second electrode layer in a thickness direction. The first conductive layer and the insulating film have a first opening portion in a region overlapping with the first electrode layer. The oxide semiconductor film has a second opening portion in a region overlapping with the first opening portion. The second conductive layer is in contact with the first electrode layer exposed in the first opening portion and the second opening portion.

12 Claims, 14 Drawing Sheets

(51) Int. Cl.
*H01L 29/786* (2006.01)
*H01L 29/66* (2006.01)
*H01L 21/4757* (2006.01)
*H01L 29/45* (2006.01)
*H01L 29/49* (2006.01)
*H01L 27/12* (2006.01)

(52) U.S. Cl.
CPC ............ *H01L 29/401* (2013.01); *H01L 29/45* (2013.01); *H01L 29/4908* (2013.01); *H01L 29/66969* (2013.01); *H01L 29/7869* (2013.01)

(58) Field of Classification Search
CPC .......................... H01L 29/45; H01L 29/4908; H01L 21/47573
USPC ............. 257/43, 59; 438/104; 365/149, 182; 327/215; 349/43
See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0166835 A1 | 7/2008 | Yen et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0068336 A1 | 3/2011 | Yamazaki et al. | |
| 2011/0121878 A1* | 5/2011 | Kato | G11C 7/04 327/215 |
| 2011/0124153 A1* | 5/2011 | Hosoba | H01L 21/02554 438/104 |
| 2012/0170355 A1* | 7/2012 | Ohmaru | G11C 11/24 365/149 |
| 2012/0175608 A1 | 7/2012 | Yamazaki | |
| 2012/0187395 A1* | 7/2012 | Koezuka | H01L 29/7869 257/43 |
| 2012/0188478 A1* | 7/2012 | Kuwabara | H01L 27/1288 349/43 |
| 2012/0188815 A1* | 7/2012 | Koyama | G11C 8/06 365/149 |
| 2012/0195115 A1* | 8/2012 | Fujita | H01L 21/84 365/182 |
| 2012/0211753 A1* | 8/2012 | Kim | H01L 27/1288 257/59 |
| 2013/0153893 A1* | 6/2013 | Morosawa | H01L 27/1225 257/43 |
| 2013/0221358 A1* | 8/2013 | Morosawa | H01L 29/66742 257/59 |
| 2013/0223135 A1* | 8/2013 | Koyama | G11C 11/412 365/149 |
| 2014/0113407 A1 | 4/2014 | Yamazaki et al. | |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-091381 A | 5/2011 |
| JP | 2012-160717 A | 8/2012 |
| WO | WO-2004/114391 | 12/2004 |
| WO | WO-2011/037010 | 3/2011 |

OTHER PUBLICATIONS

Meiboom.S et al., "Theory of The Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in The In2O3 and Sc2O3—A2O3—Bo Systems [A; Fe, Ga, or Al; B: Mg, Mn, Fe, Ni, Cu,or Zn] at Temperatures over 1000 °C.", Journal of Solid State Chemistry, 1985, vol. 60, pp. 382-384.

Nakamura.M et al., "The phase relations in the In2O3—Ga2ZnO4—ZnO system at 1350°C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m =3, 4, and 5), InGaO3(ZnO)3, and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IgZo Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IgZo Transparent Amorphous Oxide Semiconductor", IDW '08 : Proceedings of The 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of The 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

(56) References Cited

OTHER PUBLICATIONS

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies In ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B. (Physical Review, B), 2008, vol. 77, pp. 245202-1245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GiZo (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposoum Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of The 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

\* cited by examiner

SEMICONDUCTOR DEVICE AND METHOD FOR MANUFACTURING THE SAME

BACKGROUND OF THE INVENTION

1. Field of the Invention

The present invention relates to an object, a method, or a manufacturing method. in addition, the present invention relates to a process, a machine, manufacture, or a composition of matter. One embodiment of the present invention relates to a semiconductor device, a display device, a light-emitting device, a power storage device, a memory device, a driving method thereof, or a manufacturing method thereof. In particular, one embodiment of the present invention relates to a semiconductor device, a display device, or a light-emitting device each including an oxide semiconductor.

In this specification, a semiconductor device generally means a device which can function by utilizing semiconductor characteristics. An electro-optical device, an image display device, a semiconductor circuit, and an electronic device each include a semiconductor device in some cases.

2. Description of the Related Art

A technique in which a transistor is fanned using a semiconductor layer has attracted attention. The transistor is used in a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

It is known that in a transistor in which a channel is formed in an oxide semiconductor, part of hydrogen contained in the oxide semiconductor forms a donor state to increase carrier density. Thus, to obtain stable electrical characteristics of a transistor using an oxide semiconductor, some measures need to be taken to reduce the concentration of hydrogen contained in the oxide semiconductor. For example, Patent Document 1 discloses a method. for reducing the concentration of hydrogen that might be contained in an oxide semiconductor layer. In the method, the oxide semiconductor layer and an insulating layer in contact with the oxide semiconductor layer are fanned in a film formation chamber in which the concentration of impurities such as hydrogen is reduced. Patent Document 2 discloses a method for preventing entry of water, hydrogen, hydrocarbon, or the like into an oxide semiconductor layer. In the method, a resist mask used in processing for forming the oxide semiconductor layer is removed. by ashing instead of chemical liquid treatment.

REFERENCE

Patent Document

[Patent Document 1] Japanese Published Patent Application No. 2011-091381
[Patent Document 2] Japanese Published Patent Application No. 2012-160717

SUMMARY OF THE INVENTION

As mentioned above, in removal of a resist mask used in processing for forming an oxide semiconductor layer, chemical liquid treatment is not favorable in terms of preventing entry of impurities into the oxide semiconductor layer. Meanwhile, in removal of a resist mask used in processing for forming an oxide semiconductor layer, ashing treatment is sometimes not favorable either depending on the processed shape of the oxide semiconductor layer. For example, when a resist mask for forming an opening portion that reaches an electrode layer under an oxide semiconductor layer is removed by asking treatment, a surface of the electrode layer exposed in the opening portion is oxidized, which might cause poor electrical connection in the opening portion.

In view of the above, an object of one embodiment of the present invention is to provide a method for manufacturing a semiconductor device in which an electrode layer over and under an oxide semiconductor layer can be stably connected in an opening portion provided in the oxide semiconductor layer, and a semiconductor device manufactured by the method.

Another object of one embodiment of the present invention is to provide a semiconductor device using an oxide semiconductor and having high reliability. A further object of one embodiment of the present invention is to provide a novel semiconductor device.

A still further object of one embodiment of the present invention is to provide a miniaturized semiconductor device using an oxide semiconductor. Miniaturization of a transistor is essential for achieving high-speed operation and low power consumption of a transistor, low costs and high integration of a semiconductor device, and the like.

Note that the description of these Objects does not disturb the existence of other objects. One embodiment of the present invention does not necessarily achieve all the objects. Objects other than the above objects will be apparent from and can be derived from the description of the specification and the like.

One embodiment of the present invention is a semiconductor device that includes a first electrode layer; a second electrode layer positioned over the first electrode layer and including a stacked-layer structure of a first conductive layer and a second conductive layer; and an oxide semiconductor film and an insulating film positioned between the first electrode layer and the second electrode layer in a thickness direction. The first conductive layer and the insulating film have a first opening portion in a region overlapping with the first electrode layer. The oxide semiconductor film has a second opening portion in a region overlapping with the first opening portion.

The second conductive layer is in contact with the first electrode layer exposed in the first opening portion and the second opening portion.

One embodiment of the present invention is a semiconductor device that includes an island-like oxide semiconductor layer; a source electrode layer and a drain electrode layer electrically connected to the island-like oxide semiconductor layer; an oxide semiconductor film provided over the source electrode layer and the drain electrode layer and being in contact with the island-like oxide semiconductor layer; a gate insulating film over the oxide semiconductor film; a gate electrode layer overlapping with the island-like oxide semiconductor layer over the gate insulating film; and a first electrode layer overlapping with one of the source electrode layer and the drain electrode layer over the gate insulating film, The first electrode layer includes a stacked-layer structure of a first conductive layer and a second conductive layer. The first conductive layer and the gate insulating film have a first opening portion in a region overlapping with the one of the source electrode layer and the drain electrode layer. The oxide semiconductor film has a second opening portion in a region overlapping with the first opening portion. The second conductive layer is in contact with the one of the source electrode layer and the drain electrode layer exposed in the first opening portion and the second opening portion.

In the above-described semiconductor device, the gate electrode layer may include a stacked-layer structure of a third conductive layer and a fourth conductive layer formed by the same formation steps as the first conductive layer and the second conductive layer, respectively.

One embodiment of the present invention is a semiconductor device that includes a first transistor and a second transistor adjacent to the first transistor. The first transistor includes an island-like oxide semiconductor layer; a source electrode layer and a drain electrode layer electrically connected to the island-like oxide semiconductor layer; an oxide semiconductor film provided over the source electrode layer and the drain electrode layer and being in contact with. the island-like oxide semiconductor layer; a gate insulating film provided over the oxide semiconductor film; and a first gate electrode layer overlapping with the island-like oxide semiconductor layer over the pate insulating film. The second transistor includes at least a second gate electrode layer including a stacked-layer structure of first conductive layer and a second conductive layer. The first conductive layer and the gate insulating film have an opening portion overlapping with one of the source electrode layer and the drain electrode layer of the first transistor. The oxide semiconductor film has a second opening portion in a region overlapping with the first opening portion. The second conductive layer is in contact with the one of the source electrode layer and the drain electrode layer of the first transistor exposed in the first opening portion and the second opening portion.

One embodiment of the present invention is a method for manufacturing a semiconductor device that includes a step of sequentially forming an oxide semiconductor film, an insulating film, and a first conductive film over an electrode layer over a substrate; a step of forming a resist mask over the first conductive film; a step of processing the first conductive film and the insulating film using the resist mask to form a first opening portion reaching the oxide semiconductor film in a position overlapping with the electrode layer; a step of removing the resist mask; a step of processing the oxide semiconductor film using, as a mask, the first conductive film having the first opening portion to form a second opening portion reaching the electrode layer; and a step of forming, over the first conductive film, a second conductive film in contact with the electrode layer exposed in the first opening portion and the second opening portion.

In the above-described method for manufacturing the semiconductor device, the resist mask is preferably removed by ashing treatment using oxygen plasma. It is preferable that after the resist mask is removed and. before the second conductive film is formed, the ashing treatment using the oxygen plasma be performed to remove an oxide film formed on a top surface of the first conductive film.

One embodiment of the present invention makes it possible to provide a semiconductor device using an oxide semiconductor and having high reliability.

One embodiment of the present invention makes it possible to provide a miniaturized semiconductor device using an oxide semiconductor. Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

DETAILED DESCRIPTION OF THE INVENTION

Figure 1A:
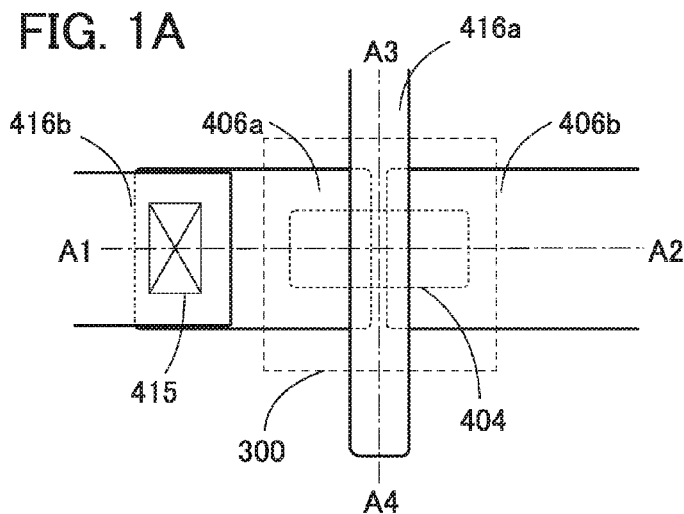
FIGS. 1A to 1C are a plan view and cross-sectional views illustrating modes of a semiconductor device.

Hereinafter, embodiments of the present invention will be described in detail with reference to the accompanying drawings. Note that the invention disclosed in this specification is not limited to the following description, and it is easily understood by those skilled in the art that modes and details of the invention can be modified in various ways. Furthermore, the invention disclosed n this specification is not construed as being limited to the description of the following embodiments. Note that in structures of one embodiment of the present invention described below, the same portions or portions having similar functions are denoted by the same reference numerals in different drawings, and description thereof is not repeated. Furthermore, the same hatching pattern is applied to portions having similar functions, and the portions are not especially denoted by reference numerals in some cases.

Note that in this specification and the like, ordinal numbers such as "first", "second", and the like are used in order to avoid confusion among components and do not limit the number.

Note that the term such as "over" or "under" in this specification and the like does not necessarily mean that a component is placed "directly on" or "directly under" another component. For example, the expression "a gate electrode layer over a gate insulating film" can mean the case where there is an additional component between the gate insulating film and the gate electrode layer. The same applies to the term "under".

In this specification and the like, a top surface of a film refers to one of the surfaces substantially parallel to a substrate surface that is farther from the substrate surface; and a bottom surface of the film refers to the other of the surfaces substantially parallel to the substrate surface that is closer to the substrate surface.

In this specification and the like, the term "parallel" indicates that the angle formed between two straight lines is greater than or equal to −10° and less than or equal to 10°, and accordingly also includes the case where the angle is greater than or equal to −5° and, less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification and the like, the trigonal and rhombohedral crystal systems are included in the hexagonal crystal system.

Furthermore, in this specification and the like, functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object. Examples of an object having any electric function are a switching element such as a transistor, a resistor, an inductor, a capacitor, and an element with a variety of functions as well as an electrode and a wiring.

(Embodiment 1)

In this embodiment, a semiconductor device and a method for manufacturing a semiconductor device that are embodiments of the present invention will be described with reference to FIGS. 1A to 1C, FIGS. 2A to 2D, FIGS. 3A to 3D, and FIGS. 4A to 4C. In this embodiment, a semiconductor device including a top gate transistor in which a channel is formed in an oxide semiconductor will be described as an example of the semiconductor device.

<Structure Example 1 of Semiconductor Device>

Figure 1B:
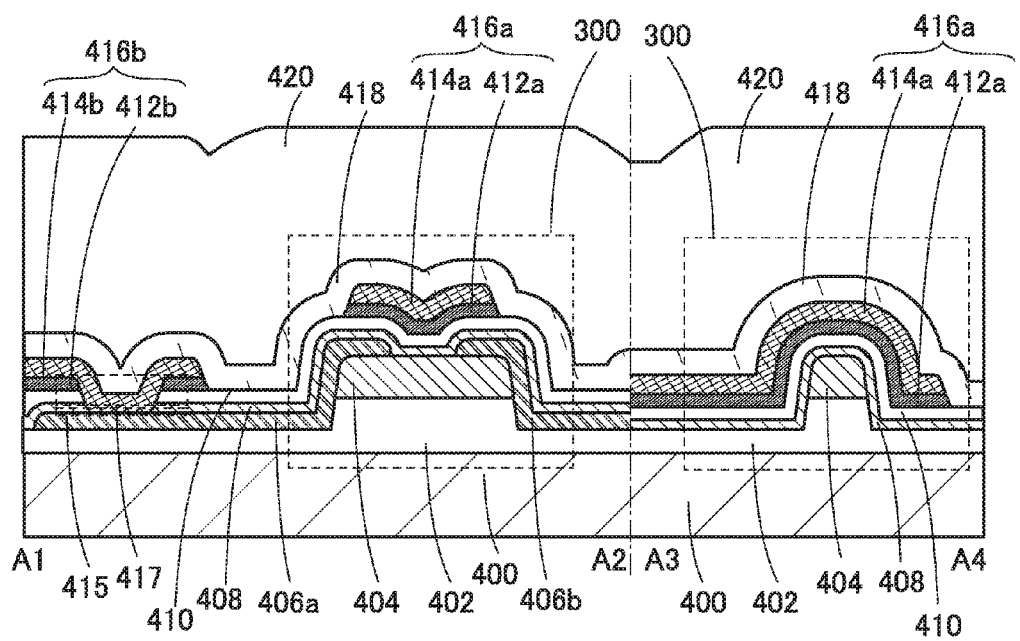

FIGS. 1A and 1B illustrate a structure example of a semiconductor device including a transistor 300. FIG. 1A is a plan view illustrating the semiconductor device, and FIG. 1B is a cross-sectional view taken along line A1-A2 and line A3-A4 of FIG. 1A. Note that in FIG. 1A, some components of the transistor 300 (e.g., a gate insulating film 410) are not illustrated for clarity.

The semiconductor device illustrated in FIGS. 1A and 1B includes the transistor 300, and an electrode layer 416b electrically connected to a source electrode layer 406a of the transistor 300. Note that the electrode layer 416b may be electrically connected to a drain electrode layer 406b instead of the source electrode layer 406a.

The electrode layer 416b includes a first conductive layer 412b and a second conductive layer 414b, which are stacked in this order. The transistor 300 includes an island-like oxide semiconductor layer 404 formed over a substrate 400 with a base insulating film 402 provided therebetween; the source electrode layer 406a and the drain electrode layer 406b electrically connected to the oxide semiconductor layer 404; an oxide semiconductor film 408 over the source electrode layer 406a and the drain electrode layer 406b; the gate insulating film 410 over the oxide semiconductor film 408; and a gate electrode layer 416a overlapping with the island-like oxide semiconductor layer 404 with the gate insulating film 410 provided therebetween. In this embodiment, the gate electrode layer 416a includes a first conductive layer 412a and a second conductive layer 414a, which are stacked in this order. Note that a protective insulating film 418 formed over the gate electrode layer 416a and/or an insulating film 420 formed over the protective insulating film 418 may be regarded as a component(s) of the transistor 300.

As illustrated in the cross-sectional view in FIG. 1B, the oxide semiconductor film 408 and the gate insulating film 410 are provided between the source electrode layer 406a of the transistor 300 and the electrode layer 416b. The first conductive layer 412b of the electrode layer 416b and the gate insulating film 410 have an opening portion 417 in a region overlapping with the source electrode layer 406a. The oxide semiconductor film 408 between the gate insulating film 410 and the source electrode layer 406a has an opening portion 415 that overlaps with the opening portion 417. The second conductive layer 414b of the electrode layer 416b is provided over the first conductive layer 412b to cover the opening portion 417 and the opening portion 415, and is in contact with the source electrode layer 406a exposed in the opening portion 417 and the opening portion 415. This structure enables electrical connection between the source electrode layer 406a of the transistor 300 and the electrode layer 416b.

The oxide semiconductor film 408 is positioned between the oxide semiconductor layer 404 where a channel is formed (which serves as a main path of current) and the gate insulating film 410, inhibits entry of impurities into the oxide semiconductor layer 404, and stabilizes the interface with the oxide semiconductor layer 404. It is preferable that the oxide semiconductor film 408 in contact with the oxide semiconductor layer 404 where a channel is formed not contain impurities such as water and hydrogen as much as possible. This is because if hydrogen is contained in the oxide semiconductor film 408 in contact with the oxide semiconductor layer 404, the hydrogen may enter the oxide semiconductor layer 404 or cause extraction of oxygen in the oxide semiconductor layer 404.

During a manufacturing process of the semiconductor device illustrated in FIGS. 1A and 1B, in the case where an opening portion is formed in the gate insulating film 410 and the oxide semiconductor film 408 and then a resist mask for forming the opening portion is removed by chemical liquid treatment, impurities such as water and hydrogen enter the oxide semiconductor film 408 through the inner side of the opening portion in some cases. Therefore, performing chemical liquid treatment to remove the resist mask is not preferable. Depending on its composition, the oxide semiconductor film 408 is soluble in a chemical liquid that is used in peeling of the resist mask, and the use of the chemical liquid might cause a shape defect of the opening portion 415. Meanwhile, in the case where an opening portion reaching the source electrode layer 406a is formed using a resist mask formed over the gate insulating film 410, and then the resist mask is removed by aching using oxygen plasma or the like, an exposed surface of the source electrode layer 406a is oxidized, leading to poor electrical connection to the electrode layer 416b to be formed later.

In view of the above, in the semiconductor device of this embodiment, the electrode layer 416b in contact with the source electrode layer 406a is formed by the following steps: the first conductive layer 412b is formed over the gate insulating film 410; the opening portion 417 is formed in the first conductive layer 412b and the gate insulating film 410; the opening portion 415 is then formed in the oxide semiconductor film 408 using the first conductive layer 412b as a mask; and the second conductive layer 414b is formed. By forming the connection portion of the electrode layers (here, the source electrode layer 406a and the electrode layer 416b) over and under the oxide semiconductor film 408 by this manufacturing method, it is possible to prevent entry of impurities such as water and shape defects due to the chemical liquid treatment, and oxidation of the surface of the electrode layer (here, the source electrode layer 406a) under the oxide semiconductor film 408 due to ashing of the resist mask; therefore, the semiconductor device can have favorable electrical characteristics.

Figure 13A:
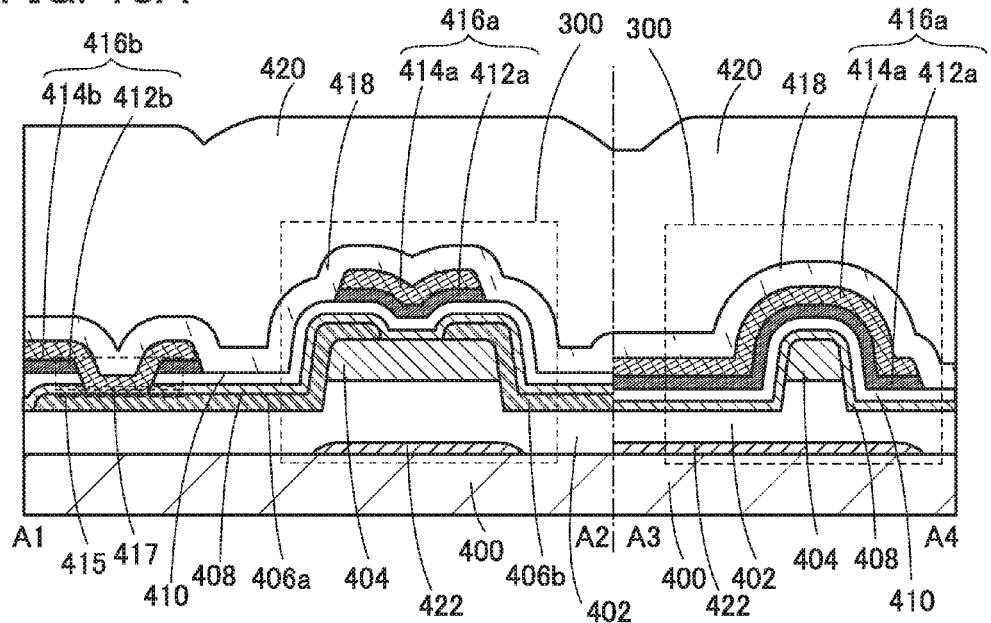
FIGS. 13A and 13B are cross-sectional views each illustrating one mode of a semiconductor device.
Figure 13B:
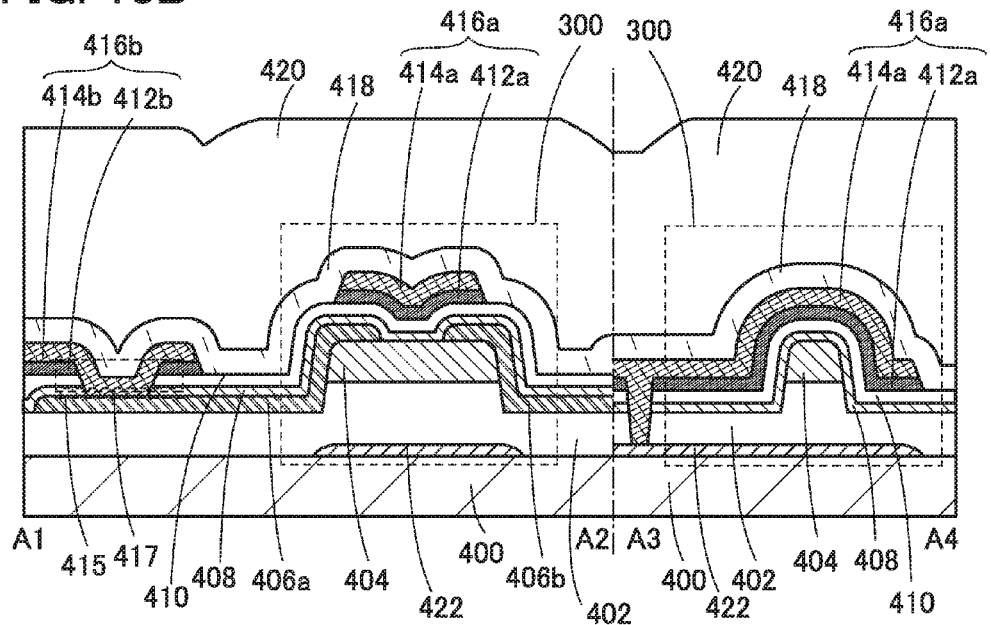

Note that one embodiment of the present invention is not limited thereto. For example, a cross-sectional structure different from that illustrated in FIG. 1B may be employed. FIG. 13A is a cross-sectional view illustrating an example in which a conductive layer 422 is provided under the oxide semiconductor layer 404. Note that as illustrated in FIG. 13B, the conductive layer 422 may be connected to the gate electrode layer 416a through an opening portion. In that case, the conductive layer 422 can function as a gate electrode (back gate electrode). In the structure illustrated in FIG. 13A, a potential supplied to the conductive layer 422 may be the same as or different from that supplied to the gate electrode layer 416a. For example, a constant potential may be supplied to the conductive layer 422 to control the threshold voltage of the transistor 300.

Details about components of the semiconductor device of this embodiment will be described below.

<<Substrate>>

The substrate 400 is not limited to a simple support, and may be a substrate where an element such as a transistor or a capacitor has already been formed. In that case, at least one of the gate electrode layer 416a, the source electrode layer 406a, and the drain electrode layer 406b of the transistor 300 may be electrically connected to the above element.

<<Base Insulating Film>>

The base insulating film 402 can have a function of supplying oxygen to the oxide semiconductor layer 404 where a channel is formed as well as a function of preventing diffusion of impurities from the substrate 400. For this reason, the base insulating film 402 is preferably an insulating film containing oxygen and further preferably, the base insulating film 402 is an insulating film containing oxygen in which the oxygen content is higher than that in the stoichiometric composition. Note that in the case where the substrate 400 is a substrate where an element is formed as described above, the base insulating film 402 also has a function as an interlayer insulating film.

In that case, a surface of the base insulating film 402 may be planarized. For example, the base insulating film 402 may be subjected to planarization treatment such as chemical mechanical polishing (CMP) treatment.

<<Oxide Semiconductor Layer>>

The oxide semiconductor layer 404 is an oxide semiconductor containing indium. An oxide semiconductor preferably contains indium because. carrier mobility (electron mobility) can be increased. Furthermore, the oxide semiconductor layer 404 preferably contains an element M, examples of which are aluminum, gallium, germanium, yttrium, zirconium, tin, lanthanum, cerium, and hafnium. The element M is an element having high bonding energy with oxygen. Alternatively; the element M is an element that can increase the energy gap of the oxide. in addition, the oxide semiconductor layer 404 preferably contains zinc. When the oxide semiconductor contains zinc, the oxide semiconductor layer 404 is easily crystallized. The energy at the top of the valence band of the oxide semiconductor can be controlled with the atomic ratio of zinc, for example. Note that the oxide semiconductor layer 404 is not limited to the oxide semiconductor containing indium. The oxide semiconductor layer 404 may be a Zn—Sn oxide or a Ga—Sn oxide, for example.

The oxide semiconductor layer 404 is formed using an oxide semiconductor with a wide energy gap. For example, the energy gap of the oxide semiconductor layer 404 is set to be greater than or equal to 2.5 eV, preferably greater than or equal to 2.8 eV, further preferably greater than or equal to 3.0 eV Note that to function as a semiconductor layer, the oxide semiconductor layer 404 has an energy gap less than or equal to 4.2 eV, preferably less than or equal to 3.6 eV, further preferably less than or equal to 3.5 eV In the case where the oxide semiconductor layer 404 is formed by a sputtering method, a target containing indium is preferably used in order to reduce the number of particles. in addition, although. the conductivity of a target might be decreased if the target is an oxide target having a high atomic ratio of the above element M, the case where a target containing indium in addition to the element M is used, the conductivity of the target can be prevented from being decreased or can be increased, and DC discharge and AC discharge can be facilitated. This is advantageous in film formation over a large-sized substrate. In other words, semiconductor devices can be manufactured with high productivity when the oxide semiconductor layer 404 is formed using a target containing indium.

In the case where the oxide semiconductor layer 404 is formed by a sputtering method, the atomic ratio of In to M and Zn contained in the target to be used may be 3:1:1, 3:1:2, 3:1:4, 1:1:0.5, 1:1:1, or 1:1:2, for example. In the case where the oxide semiconductor layer 404 is formed by a sputtering method, the atomic ratio in the oxide semiconductor layer 404 to be formed is not always the same as the atomic ratio in the target to be used. In particular, the atomic ratio of zinc in the formed oxide semiconductor layer 404 becomes lower than that in the target in some cases. Specifically, the atomic percentage of zinc in the formed oxide semiconductor layer 404 is higher than or equal to approximately 40% and lower than or equal to approximately 90% of that of zinc in the target in sonic cases.

In order to stabilize the electrical characteristics of the transistor 300, it is effective to reduce the concentration of impurities in the oxide. semiconductor layer 404 where a channel is formed so that the oxide semiconductor layer 404 has a lower carrier density and is highly purified intrinsic. The carrier density of the oxide semiconductor layer 404 is preferably set to be lower than $1\times10^{17}/cm^3$, lower than $1\times10^{15}/cm^3$, or lower than $1\times10^{13}/cm^3$. As examples of impurities that can be factors in generating carriers in an oxide semiconductor, silicon, hydrogen, and nitrogen can be given. When oxygen vacancies exist in the oxide semiconductor layer 404, some of the oxygen vacancies serve as a donor to release an electron that is a carrier.

For example, when the oxide semiconductor layer 404 contains silicon, an impurity state formed by silicon serves as a carrier trap in some cases. Therefore, the concentration of silicon in a region between the oxide semiconductor layer 404 and the base insulating film 402 measured by secondary ion mass spectrometry (SIMS) is set to be lower than $1\times10^{19}$ atoms/cm$^3$, preferably lower than 5×10$^{18}$ atoms/cm$^3$, further preferably lower than 2×10$^{18}$ atoms/cm$^3$, Furthermore, when hydrogen is contained in the oxide semiconductor layer 404, the carrier density is increased in some cases. Accordingly, the concentration of hydrogen in the oxide semiconductor layer 404 measured by SIMS is set to be lower than or equal to 2×10$^{20}$ atoms/cm$^3$, preferably lower than or equal to 5×10$^{19}$ atoms/cm$^3$, further preferably lower than or equal to 1×10$^{19}$ atoms/cm$^3$, still further preferably lower than or equal to 5×10$^{18}$ atoms/cm$^3$. When nitrogen is contained in the oxide semiconductor layer 404, the carrier density is increased in some cases. The concentration of nitrogen in the oxide semiconductor layer 404 measured by SIMS is set to be lower than 5×10$^{19}$ atoms/cm$^3$, preferably lower than or equal to 5×10$^{18}$ atoms/cm$^3$, further preferably lower than or equal to 1×10$^{18}$ atoms/cm$^3$, still further preferably lower than or equal to 5×10$^{17}$ atoms/cm$^3$.

It is preferable to reduce the concentration of hydrogen in the base insulating film 402 in order to reduce the concentration of hydrogen in the oxide semiconductor layer 404. The concentration of hydrogen in the base insulating film 402 measured by SIMS is set to be lower than or equal to 2×10$^{20}$ atoms/cm$^3$, preferably lower than or equal to 5×10$^{19}$ atoms/cm$^3$, further preferably lower than or equal to 1×10$^{19}$ atoms/cm$^3$ still further preferably lower than or equal to 5×10$^{18}$ atoms/cm$^3$. It is preferable to reduce the concentration of nitrogen in the base insulating film 402 in order to reduce the concentration of nitrogen in the oxide semiconductor layer 404. The concentration of nitrogen in the base insulating film 402 measured by SIMS is set to be lower than 5×10$^{19}$ atoms/cm$^3$, preferably lower than or equal to 5×10$^{18}$ atoms/cm$^3$ further preferably lower than or equal to 1×10$^{18}$ atoms/cm$^3$, still further preferably lower than or equal to 5×10$^{17}$ atoms/cm$^3$.

<<Source Electrode Layer and Drain Electrode Layer>>

As the source electrode layer 406a and the drain electrode layer 406b, a. conductive layer capable of extracting oxygen from the oxide semiconductor layer 404 is preferably used. As an example of such a conductive layer, a conductive layer containing aluminum, titanium, chromium, nickel, molybdenum, tantalum, tungsten, or the like can be given.

By the conductive layer capable of extracting oxygen from the oxide semiconductor layer 404, oxygen in the oxide semiconductor layer 404 is released to farm oxygen vacancies in the oxide semiconductor layer 404 in some cases. Oxygen is more likely to be extracted as the temperature is higher. Since the manufacturing process of the transistor involves some heat treatment steps, oxygen vacancies are likely to be formed in the oxide semiconductor layer 404 in a region that is in contact with the source electrode layer 406a or the drain electrode layer 406b and in a region in the vicinity of the above region. The region in which oxygen vacancies are formed becomes an n-type region. Furthermore, hydrogen enters sites of the oxygen vacancies by heating, and thus the oxide semiconductor layer 404 becomes n-type in some cases. Thus, because of the source electrode layer 406a and the drain electrode layer 406b, the resistance of a region where the oxide semiconductor layer 404 is in contact with the source electrode layer 406a or the drain electrode layer 406b is reduced, so that the on-state resistance of the transistor 300 can be reduced.

In the case where a transistor with a short channel length (e.g., less than or equal to 200 nm, or less than or equal to 100 nm) is manufactured, a source and a drain might be short-circuited because of formation of an n-type region. Therefore, in the case where a transistor with a short channel length is manufactured, a conductive layer capable of appropriately extracting oxygen from the oxide semiconductor layer 404 may be used as the source electrode layer 406a and the drain electrode layer 406b. As the conductive layer capable of appropriately extracting oxygen, a conductive layer containing nickel, molybdenum, or tungsten can be used, for example.

Furthermore, in the case where a transistor with an extremely short channel length (less than or equal to 40 nm, or less than or equal to 30 nm) is manufactured, a conductive layer which is less likely to extract oxygen from the oxide semiconductor layer 404 may be used as the source electrode layer 406a and the drain electrode layer 406b. As an example of the conductive layer which is less likely to extract oxygen from the oxide semiconductor layer 404, a conductive layer containing tantalum nitride, titanium nitride, or ruthenium can be given. Note that a plurality of kinds of conductive layers may be stacked.

Note that when a transistor with an extremely small channel length (40 nm or less, or 30 nm or less) is manufactured, part of a conductive film over a channel formation region between the source electrode layer 406a and the drain electrode layer 406b is etched using resist masks that are formed by processing using a method suitable for fine line processing, such as electron beam exposure. Note that by the use of a positive type resist for the resist masks, the exposed region can be minimized. and throughput can be thus improved. in the above manner, a transistor having a channel length of 30 nm or less can be manufactured.

In this embodiment, as illustrated in FIG. 1B, side surfaces of the source electrode layer 406a and the drain electrode layer 406b are in contact with the side surfaces of the oxide semiconductor layer 404. The oxide semiconductor layer 404 can be electrically surrounded by an electric field of the gate electrode layer 416a (a transistor structure in which an oxide semiconductor layer is electrically surrounded by an electric field of a gate electrode layer is referred to as a surrounded channel (s-channel) structure). Therefore, a channel is formed in the entire oxide semiconductor layer 404 (bulk). In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, further preferably less than or equal to 30 nm, still further preferably less than or equal to 20 nm and the channel width of the transistor is preferably less than or equal to 40 nm, further preferably less than or equal to 30 nm, still further preferably less than or equal to 20 nm.

Note that a channel length refers to a distance between a source (a source region or a source electrode layer) and a drain (a drain region or a drain electrode layer) in a region where a semiconductor layer and a gate electrode layer overlap with each other in a top view. Accordingly, in FIGS. 1A and 1B, a channel length is a distance between the source electrode layer 406a and the drain electrode layer 406b in a region where the oxide semiconductor layer 404 and the gate electrode layer 416a overlap with each other. A channel width refers to a length of a region where a source faces parallel to a drain and where a semiconductor layer and a gate electrode layer overlap with each other. Accordingly, in FIGS. 1A and 1B, a channel width is a length of a region where the source electrode layer 406a faces parallel to the drain electrode layer 406b and where the oxide semiconductor layer 404 and the gate electrode layer 416a overlap with each other.

<<Oxide Semiconductor Film>>

As the oxide semiconductor film 408, which is formed over the source electrode layer 406a and the drain electrode layer 406b and is in contact with the oxide semiconductor layer 404 where a channel is formed, an oxide semiconductor film that contains, as a constituent element, at least one of metal elements included in the oxide semiconductor layer 404 is used. In the case where an insulating layer that contains an element (e.g., silicon) different from the elements included in the oxide semiconductor layer 404 is formed in contact with the oxide semiconductor layer 404, trap states are formed at the interface between the oxide semiconductor layer 404 and the insulating layer in some cases. However, since the oxide semiconductor film 408 in contact with the oxide semiconductor layer 404 in this embodiment contains one or more kinds of metal elements included in the oxide semiconductor layer 404, scattering of carriers does not easily occur at the interface with the oxide semiconductor layer 404. As a result, the field-effect mobility of the transistor can be increased. Owing to the oxide semiconductor film 408, even when an insulating layer containing an element (e.g., silicon) different from the elements in the oxide semiconductor layer 404 is used. as the gate insulating film 410, trap states that might be formed at the interface between the oxide semiconductor film 408 and the gate insulating film 410 can be prevented from adversely affecting the oxide semiconductor layer 404 where a channel is formed.

When an oxide semiconductor material represented by an In-M-Zn oxide that contains indium, zinc, and an element M (aluminum, gallium, germanium, yttrium, zirconium, tin, lanthanum, cerium, or hafnium) is used for the oxide semiconductor layer 404, it is preferable to use, for the oxide semiconductor film 408, an oxide semiconductor material which is represented by an In-M-Zn oxide and in which the atomic ratio of M to indium is higher than in the oxide semiconductor layer 404. It is further preferable that in the case where the oxide semiconductor layer 404 is an In-M-Zn oxide, In:M:Zn=$x_1$:$y_1$:$z_1$ [atomic ratio] is satisfied in the oxide semiconductor layer 404, and In:M:Zn=$x_2$:$y_2$:$z_2$ [atomic ratio] is satisfied in the oxide semiconductor film 408, $y_2/x_2$ be 1.5 times or more, further preferably twice or more, still further preferably 3 times or more as large as $y_1/x_1$. At this time, when $y_1$ is greater than or equal to $x_1$ in the oxide semiconductor layer 404, the transistor can have stable electrical characteristics. However, when $y_1$ is 3 times or more as large as the field-effect mobility of the transistor is reduced; accordingly, $y_1$ is preferably smaller than 3 times $x_1$.

In the case where the oxide semiconductor film 408 is formed by a sputtering method, the atomic ratio of in to M and Zn contained in the target to be used may be 1:3:2, 1:4:4, 1:6:4, or 1:9:6, for example.

Since the element M has a function of increasing the energy gap of an oxide, the oxide semiconductor film 408 has a wider energy gap than the oxide semiconductor layer 404. Here, if the atomic ratio of the element M to indium is too high, the energy gap of the oxide semiconductor film 408 is increased and the oxide semiconductor film 408 might function as an insulating layer. Therefore, it is preferable to adjust the atomic ratio of the element M to indium such that the oxide semiconductor film 408 functions as a semiconductor layer. Depending on the atomic ratio of M to indium, the oxide semiconductor film 408 might function as an insulating film (e.g., as part of the gate insulating film).

Since the element M has high bonding energy with oxygen as described above, in the oxide semiconductor film 408, in which the atomic ratio of the element M to indium is higher than in the oxide semiconductor layer 404, oxygen vacancies are less easily formed than in the oxide semiconductor layer 404. Because the oxide semiconductor film 408 in which oxygen vacancies are not easily generated is formed in contact with the oxide semiconductor layer 404 where a channel is formed, oxygen vacancies in the oxide semiconductor layer 404 can be reduced. Because the oxide semiconductor film 408 is provided between the gate insulating film 410 and the oxide semiconductor layer 404, trap states due to oxygen vacancies are prevented from being formed at the interface with the oxide semiconductor layer 404 on the gate insulating film 410 side.

In order that a channel can be formed in the oxide semiconductor layer 404 when an electric field is applied to the gate electrode layer 416a, an energy difference needs to be provided between the conduction band minimums of the oxide semiconductor film and the oxide semiconductor layer. Specifically, the oxide semiconductor film 408 is formed using an oxide whose conduction band minimum is closer to a vacuum level than the conduction band minimum of the oxide semiconductor layer 404 is. In other words, an oxide that has a lower electron affinity (the energy difference between the vacuum level and the conduction band minimum) than the oxide semiconductor layer 404 is used for the oxide semiconductor film 408. For example, it is preferable that as the oxide semiconductor film 408, an oxide having an electron affinity lower than that of the oxide semiconductor layer 404 by 0.07 eV or higher and 1.3 eV or lower, further preferably 0.1 eV or higher and 0.7 eV or lower, still further preferably 0.15 eV or higher and 0.4 eV or lower be used.

In some cases, there is a mixed region of the oxide semiconductor layer 404 and the oxide semiconductor film 408 between the oxide semiconductor layer 404 and. the oxide semiconductor film 408. Because the mixed region has a low interface state density, the stacked-layer structure of the oxide semiconductor layer 404 and the oxide semiconductor film 408 has a band structure where energy at each interface and in the vicinity of the interface is changed continuously (continuous junction).

Moreover, the thickness of the oxide semiconductor film 408 is preferably as small as possible to increase the on-state current of the transistor. The thickness of the oxide semiconductor film 408 is set to be less than 10 nm, preferably less than or equal to 5 nm, further preferably less than or equal to 3 nm, for example. Meanwhile, the oxide semiconductor film 408 has a function of blocking elements other than oxygen (such as silicon) included in the gate insulating film 410 from entering the oxide semiconductor layer 404 where a channel is formed. For this reason, it is preferable that the oxide semiconductor film 408 have a certain thickness. The thickness of the oxide semiconductor film 408 is set to be greater than or equal to 0.3 nm, preferably greater than or equal to 1 nm, further preferably greater than or equal to 2 nm, for example.

To improve the reliability, it is preferable to reduce the concentration of impurities in the oxide semiconductor film 408. For example, the concentration of silicon in a region between the oxide semiconductor layer 404 and the oxide semiconductor film 408 measured by SIMS is set to be lower than $1 \times 10^{19}$ atoms/$cm^3$, preferably lower than $5 \times 10^{18}$ atoms/$cm^3$, further preferably lower than $2 \times 10^{18}$ atoms/$cm^3$. Furthermore, the concentration of hydrogen in the oxide semiconductor film 408 measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen in the oxide semiconductor film 408 measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$ still further preferably lower than or equal to $5\times10^{17}$ atoms/cm$^3$.

<<Gate Insulating Film>>

The gate insulating film 410 can be formed to have a single-layer structure or a stacked-layer structure using, for example, one or more of silicon oxide, silicon oxynitride, silicon nitride oxide, silicon nitride, aluminum oxide, hafnium oxide, gallium oxide, Ga—Zn-based metal oxide, silicon nitride, and the like. The gate insulating film 410 may be formed using a high-k material such as hafnium silicate (HfSiO$_x$), hafnium silicate to which nitrogen is added (Hf-Si$_x$O$_y$N$_z$), hafnium aluminate to which nitrogen is added (HfAl$_x$O$_y$N$_z$), hafnium oxide, or yttrium oxide, so that gate leakage current of the transistor can be reduced.

<<Electrode Layer>>

The electrode layer 416b has a stacked-laver structure of the first conductive layer 412b that functions as a hard mask at the time of forming the opening portion 415 in the oxide semiconductor film 408 and the gate insulating film 410, and the second. conductive layer 414b over the first conductive layer 412b. The first conductive layer 412b and the second conductive layer 414b can be formed using films appropriately selected from the following: a metal film containing any of molybdenum, titanium, tantalum, tungsten, aluminum, copper, chromium, neodymium, and scandium; a metal nitride film containing the above element as a component (e.g., a tantalum nitride film, a titanium nitride film, a molybdenum nitride film, or a tungsten nitride film); and the like. Alternatively, a semiconductor film typified by a polycrystalline silicon film doped with an impurity element such as phosphorus, or a silicide film such as a nickel silicide film may be used for the first conductive layer 412b or the second conductive layer 414b. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

<<Gate Electrode Layer>>

The gate electrode layer 416a can be formed by the same step as the electrode layer 416h described above. Therefore, the gate electrode layer 416a has a stacked-layer structure of the first conductive layer 412a being in contact with the gate insulating film 410 and formed using the same material as the first conductive layer 412b, and the second. conductive layer 414a provided over the first conductive layer 412a and formed using the same material as the second conductive layer 414b. Note that for the first conductive layer 412a that is in contact with the gate insulating film 410 in the gate electrode layer 416a, it is preferable to use a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (e.g., an indium nitride film, a tin nitride film, a tantalum nitride film, or a titanium nitride film). Such a film has a work function of higher than or equal to 5 eV, preferably higher than or equal to 5.5 eV and the use of this film as the gate electrode layer enables the threshold voltage of the transistor to be shifted in the positive direction. Accordingly, a normally-off switching element can be obtained.

In this embodiment, a tantalum nitride film or a titanium nitride film is used for the first conductive layers 412a and 412b, and a tungsten film is used for the second conductive layers 414a and 414b.

In the semiconductor device of this embodiment, the gate electrode layer 416a of the transistor 300 and the electrode layer 416b connected to the source electrode layer 406a or the drain electrode layer 406b of the transistor 300 are preferably formed by the same step because the number of masks used for manufacturing the semiconductor device can be reduced. Note that this embodiment is not limited thereto, and the gate electrode layer 416a and the electrode layer 416 may be formed by different steps. For example, the following process may be employed: after the gate electrode layer 416a of the transistor 300 is formed, an insulating film covering the transistor 300 is formed; then, the electrode layer 416b electrically connected to the source electrode layer 406a or the drain electrode layer 406b is formed over the insulating film. In this case, the gate electrode layer 416a may have a single-layer structure.

<<Protective Insulating Film>>

As the protective insulating film 418 over the transistor 300, an insulating film having a lower permeability to oxygen (higher barrier property against oxygen) than the oxide semiconductor film 408 and the gate insulating film 410 is provided. Providing the protective insulating film 418 having, a barrier property against oxygen in contact with the gate insulating film 410 makes it possible to prevent release of oxygen from the gate insulating film 410 and the oxide semiconductor film 408 in contact with the gate insulating film 410. This leads to prevention of oxygen extraction from the oxide semiconductor layer 404 due to oxygen vacancies in the films; consequently, generation of oxygen vacancies in the channel formation region can be prevented. As the protective insulating layer, for example, an aluminum oxide film, a silicon nitride film, or a silicon nitride oxide film can be provided.

Further, in an oxide semiconductor, hydrogen behaves as a supply source of carriers in addition to oxygen vacancies. When the oxide semiconductor contains hydrogen, a donor is generated at a level close to the conduction band (a shallow level), and thus the oxide semiconductor has lower resistance (n-type conductivity). Accordingly, the concentration of hydrogen in the protective insulating film 418 is preferably reduced. Specifically, the concentration of hydrogen in the protective insulating film 418 is preferably lower than $5\times10^{19}$ cm$^{-3}$, further preferably lower than $5\times10^{18}$ cm$^3$.

An aluminum oxide film has a barrier property against hydrogen as well as a barrier property against oxygen. It is thus favorable to use an aluminum oxide film as the protective insulating film 418.

<<Insulating Film>>

The insulating film 420 is stacked over the protective insulating film 418, whereby the withstand voltage of the transistor 300 can be increased. The insulating film 420 can be formed using an inorganic insulating material, and the thickness of the insulating film 420 is preferably larger than at least the thickness of the protective insulating film 418.

<Structure Example 2 of Semiconductor Device>

The structure of the semiconductor device of this embodiment is not limited to that described above. Another structure example of the oxide semiconductor layer 404 that can be used for the semiconductor device of this embodiment is described below.

<<Modification Example of Oxide Semiconductor Layer>>

Figure 1C:
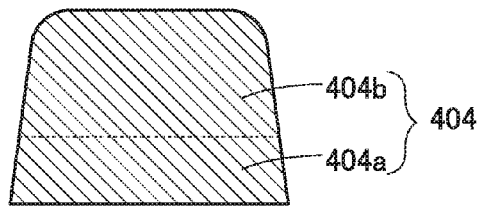

The oxide semiconductor layer 404 may be a stack of oxide semiconductor layers. For example, as illustrated in FIG. 1C, the oxide semiconductor layer 404 may have a stacked-layer structure of an oxide semiconductor layer 404a and an oxide semiconductor layer 404b where a channel is formed.

For the oxide semiconductor layer 404b (middle layer) where a channel is formed, the above description of the oxide semiconductor layer 404 can be referred to. As the oxide semiconductor layer 404a, which is provided between the oxide semiconductor layer 4041 where a channel is formed and the base insulating film 402, an oxide semiconductor layer that contains, as a constituent element, at least one of metal elements included in the oxide semiconductor layer 404b is used. Providing the oxide semiconductor layer 404a can inhibit formation of trap states at the interface with the oxide semiconductor layer 404b and can prevent trap states formed at the interface between the oxide semiconductor layer 404a and the base insulating film 402 from adversely affecting the oxide semiconductor layer 404b where a channel is formed. The specific structure of the oxide semiconductor layer 404a can be the same as that of the above-described oxide semiconductor film 408.

To improve reliability, preferably, the thickness of the oxide semiconductor layer 404a is large and the thickness of the oxide semiconductor film 408 is small. Specifically, the thickness of the oxide semiconductor layer 404a is set to be greater than or equal to 20 nm, preferably greater than or equal to 30 nm, further preferably greater than or equal to 40 nm, still further preferably greater than or equal to 60 nm. With the oxide semiconductor layer 404a having a thickness greater than or equal to 20 nm, preferably greater than or equal to 30 nm, further preferably greater than or equal to 40 nm, still further preferably greater than or equal to 60 nm, the distance from the interface between the base insulating film 402 and the oxide semiconductor layer 404a to the oxide semiconductor layer 404b where a channel is formed can be greater than or equal to 20 nm, preferably greater than or equal to 30 nm, further preferably greater than or equal to 40 nm, still further preferably greater than or equal to 60 nm. Note that since the productivity of the semiconductor device might be reduced, the thickness of the oxide semiconductor layer 404a is set to be less than or equal to 200 nm, preferably less than or equal to 120 nm, further preferably less than or equal to 80 nm.

<Method for Manufacturing Semiconductor Device>

A method for manufacturing the semiconductor device illustrated in FIGS. 1A and 1B will be described with reference to FIGS. 2A to 2D, FIGS. 3A to 3D, and FIGS. 4A to 4C.

Figure 2A:
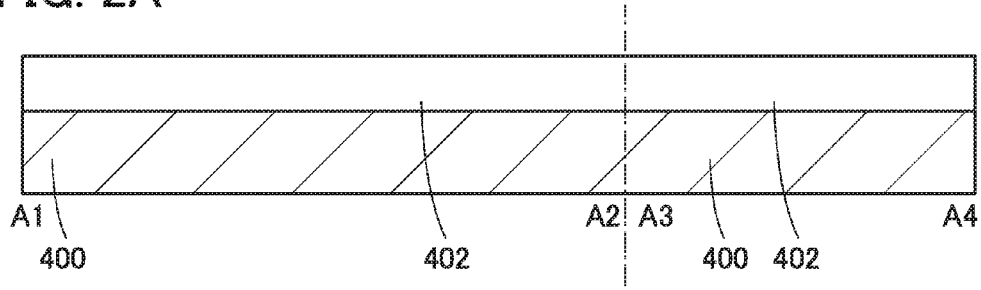
FIGS. 2A to 2D are cross-sectional views illustrating a method for manufacturing a semiconductor device.
Figure 2B:
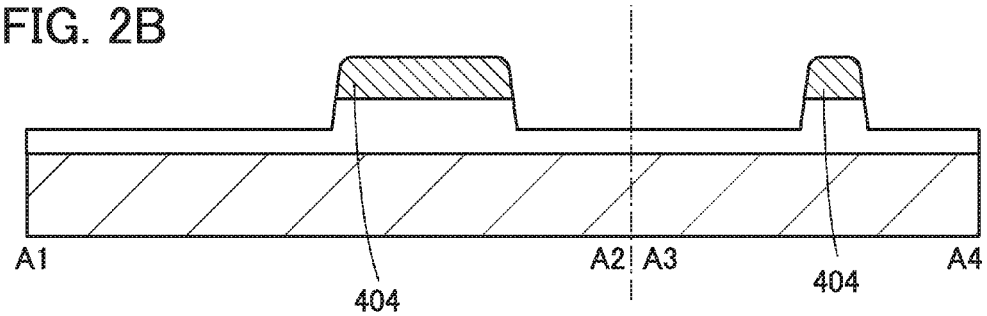
Figure 2C:
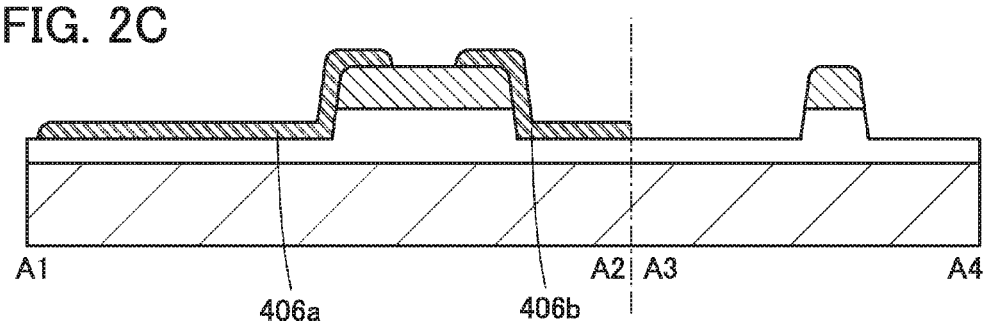

The base insulating film 402 is formed over the substrate 400 (see FIG. 2A). The base insulating film 402 may be formed by a sputtering method, a chemical vapor deposition (CVD) method (including a metal-organic chemical vapor deposition (MOCVD) method and a plasma-enhanced chemical vapor deposition (PECVD) method), a molecular beam epitaxy (MBE) method, an atomic layer deposition (ALD) method, or a pulsed laser deposition (PLD) method. For less plasma damage to a deposited film, an MOCVD method or an ALD method is preferably used.

After formation of the base insulating film 402, in order to planarize the surface of the base insulating film 402, CMP treatment may be performed. By CMP treatment, the average surface roughness (Ra) of the base insulating film 402 is less than or equal to 1 nm, preferably less than or equal to 0.3 nm, further preferably less than or equal to 0.1 nm. In some cases, Ra that is less than or equal to the above value can increase the crystallinity of the oxide semiconductor layer 404. Ra can be measured using an atomic force microscope (AFM).

Then, oxygen may be added to the base insulating film 402 so that an insulating layer containing excess oxygen can be formed. Oxygen may be added by plasma treatment, an ion implantation method, or the like. In the case where the addition of oxygen is performed by an ion implantation method, the acceleration voltage may be higher than or equal to 2 kV and lower than or equal to 100 kV and the dose may be greater than or equal to $5\times10^{14}$ ions/cm$^2$ and less than or equal to $5\times10^{16}$ ions/cm$^2$, for example.

Next, an oxide semiconductor film to be the oxide semiconductor layer 404 is formed over the base insulating film 402 by a sputtering method, a CVD method, an MBE method, an ALD method, or a PLD method. Then, the oxide semiconductor film is processed by etching using photolithography to have an island-like shape, whereby the oxide semiconductor layer 404 is formed (see FIG. 2B). By this etching treatment, the base insulating film 402 may also be etched to have a reduced thickness in a region not covered with the oxide semiconductor layer 404. Note that the base insulating film 402 is etched such that a surface of the substrate 400 (or a surface of a film under the base insulating film 402) is not exposed. When the base insulating film 402 has a reduced thickness in the region not covered with the oxide semiconductor layer 404, the gate electrode layer to be formed later can face a bottom end portion of the oxide semiconductor layer in the thickness direction or a part in the vicinity of the end portion, so that voltage can be applied to the whole oxide semiconductor layer 404.

In the case where a stacked-layer structure including the oxide semiconductor layer 404a and the oxide semiconductor layer 404b is formed as the oxide semiconductor layer 404, it is preferable that films to be stacked to form the layers be successively mined without exposure to the air.

In order to suppress entry of impurities to form the oxide semiconductor layer 404 having high crystallinity, an oxide semiconductor film to be the oxide semiconductor layer 404 is formed at a substrate temperature of higher than or equal to 100° C., preferably higher than or equal to 150° C., further preferably higher than or equal to 200° C. As an oxygen gas or an argon gas used as a deposition gas, a highly purified gas whose dew point is lower than or equal to −40° C., preferably lower than or equal to −80° C., further preferably lower than or equal to −100° C. is used. The state in which impurity concentration is low and density of defect states is low (the number of oxygen vacancies is small) is referred to as "highly purified intrinsic" or "substantially highly purified intrinsic".

First heat treatment may be performed after the oxide semiconductor layer 404 is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor layer 404 can be increased, and in addition, impurities such as hydrogen and water can be removed from the base insulating film 402.

Next, a conductive film to be the source electrode layer 406a and the drain electrode layer 406b is formed over the oxide semiconductor layer 404. The conductive film may be formed by, a sputtering method, a CVD method, an MBE method, an ALD method, or a PLD method. After that, the conductive film is divided by etching to form the source electrode layer 406a and the drain electrode layer 406b (see FIG. 2C). Note that when the conductive film is etched, end portions of the source electrode layer 406a and the drain electrode layer 406b are rounded (have curved surfaces) in some cases. Furthermore, when the conductive film is etched, the base insulating film 402 in a region not covered with the source electrode layer 406a, the drain electrode layer 406b, and the oxide semiconductor layer 404 may be etched to have a reduced thickness.

Note that if the conductive film to be the source electrode layer 406a and the drain electrode layer 406b remains over the oxide semiconductor layer 404 as a residue, the residue may form an impurity state in the oxide semiconductor layer 404 or at the interface thereof. Further, oxygen extraction from the oxide. semiconductor layer 404 may be caused by the residue to form an oxygen vacancy. Therefore, treatment for removing the residue may be performed on the surface of the oxide semiconductor layer 404 after the source electrode layer 406a and the drain electrode layer 406b are formed. As the treatment for removing the residue, etching treatment (e.g., wet etching) or plasma treatment using oxygen or dinitrogen monoxide may be employed. The treatment for removing the residue may reduce the thickness of the oxide semiconductor layer 404 between the source electrode layer 406a and the drain electrode layer 406b by 1 nm or more and 3 nm or less, approximately.

Figure 2D:
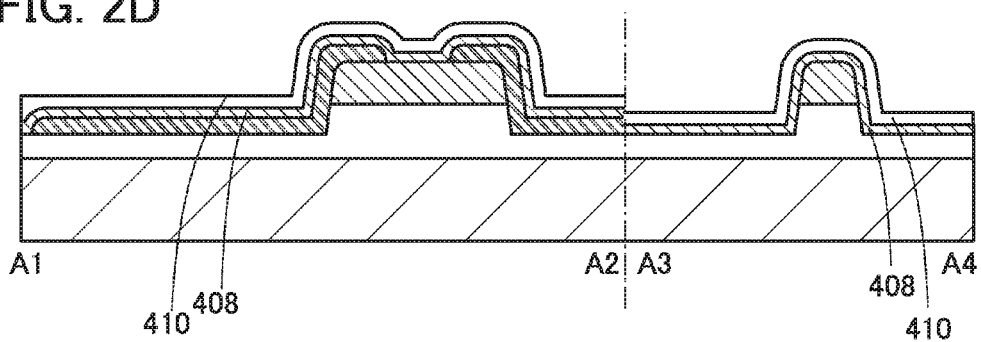

Next, the oxide semiconductor film 408 and the gate insulating film 410 are stacked over the source electrode layer 406a and the drain electrode layer 406b (see FIG. 2D). It is preferable to form the oxide semiconductor film 408 and the gate insulating film 410 in succession without exposure to the air, in order to prevent adsorption of an impurity such as hydrogen or moisture on a surface of the oxide semiconductor film 408.

The oxide semiconductor film 408 can be formed by a sputtering method, a CVD method, an MBE method, an ALD) method, or a PLD method. Note that as in the case of the oxide semiconductor film to be the oxide semiconductor layer 404, in order that entry of impurities can be inhibited and the oxide semiconductor film 408 with high.

crystallinity can be formed, film formation is performed at a. substrate temperature of higher than or equal to 100° C., preferably higher than or equal to 150° C., further preferably higher than or equal to 200° C. As an oxygen gas or an argon gas used as a deposition gas, a highly purified gas whose dew point is lower than or equal to −40° C., preferably lower than or equal to −80° C., further preferably lower than or equal to −100° C. is used.

The gate insulating film 410 can be formed by a sputtering method, an MBE method, a CVD method, a pulsed laser deposition method, an ALD method, or the like using the above-described material. For example, the gate insulating film 410 is preferably formed by a high-density plasma CVD method using microwave (e.g., a frequency of 2.45 GHz), whereby the gate insulating film 410 can be formed dense with high withstand voltage.

Figure 3A:
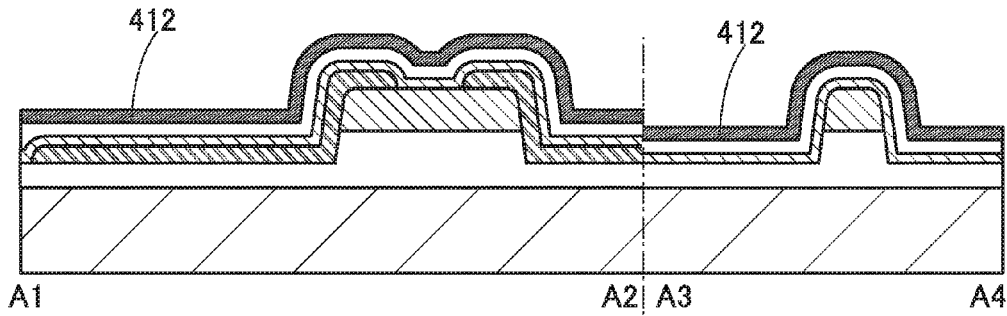
FIGS. 3A to 3D are cross-sectional views illustrating a method for manufacturing a semiconductor device.
Figure 3B:
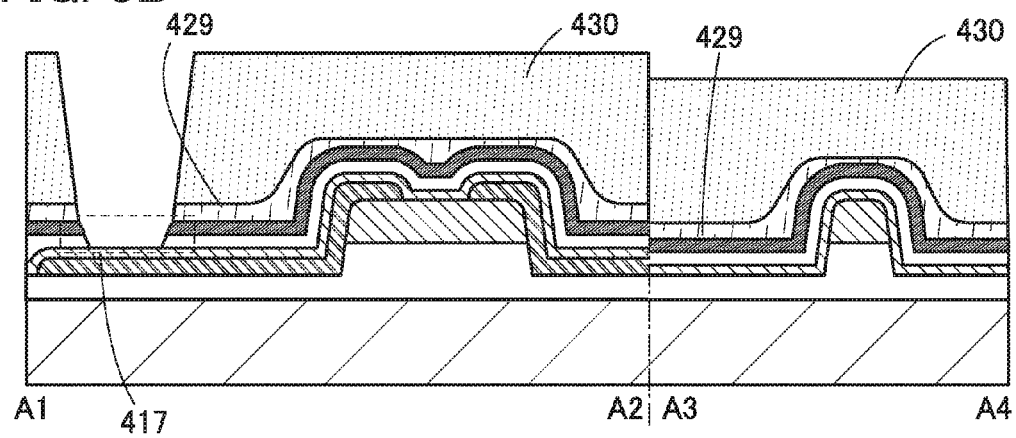

Next, a conductive film 412 for forming the first conductive layers 412a and 412b is formed over the gate insulating film 410 (see FIG. 3A). The conductive film 412 may be formed by a sputtering method, a CVD method, an MBE method, an ALD method, or a PLD method. In this embodiment, a tantalum nitride film or a titanium nitride film is formed as the conductive film 412.

Then, an organic coating film 429 and a resist mask 430 are formed over the conductive film 412, and the organic coating film 429, the conductive film 412, and the gate insulating film 410 are etched using the resist mask 430. By this etching step, the opening portion 417 reaching the oxide semiconductor film 408 is formed in the conductive film 412 and the gate insulating film 410 in a region overlapping with the source electrode layer 406a (see FIG. 3B), Providing the organic coating film 429 can improve the adhesion of the resist mask 430. In the ease where the adhesion of the resist mask 430 is sufficient, the organic coating film 429 is not necessarily provided. As the organic coating film 429, a bottom anti-reflective coating (BARC) film such as SWK-T7 (manufactured by TOKYO OHKA KOGYO CO., LTD), an adhesion promoter such as AZ AD Promoter (manufactured by AZ ELECTRONIC MATERIALS), or the like can be used.

As light used for the exposure in processing for forming the resist mask 430, it is possible to use light with an h-line (wavelength: 365 nm), light with a g-line (wavelength: 436 nm), light with an h-line (wavelength: 405 nm), light in which the i-line, the g-line, and the h-line are mixed, or the like, with which a resist film for forming the resist mask 430 can be irradiated through a photomask. Exposure may be performed by liquid immersion exposure technique. For the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning of a beam such as an electron beam, a photomask is not needed. Note that to miniaturize the semiconductor device, the area of the opening portion 417 is preferably reduced. To reduce the opening portion 417 in size, the resist mask 430 is formed by processing using, for example, a method suitable for tine line processing, such as electron beam exposure.

Figure 3C:
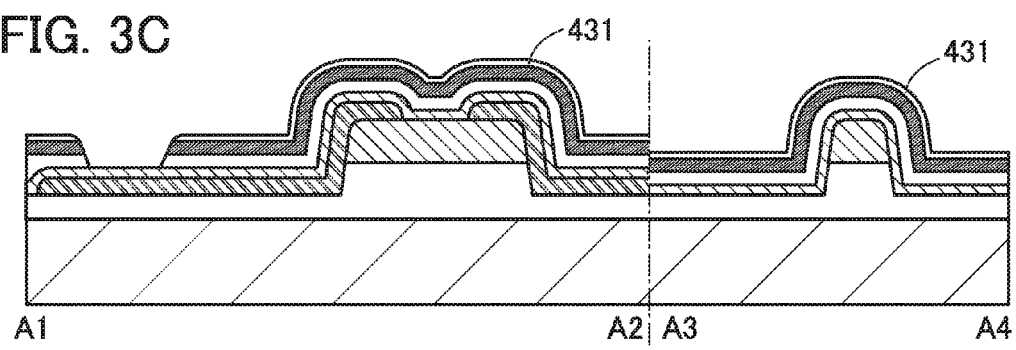

Then, the resist mask 430 is removed (see FIG. 3C). Ashing; treatment using oxygen plasma treatment or the like is preferably employed to remove the resist mask 430. When ashing treatment is performed on the resist mask 430 with the oxide semiconductor film 408 exposed in the opening portion 417, plasma damage to the gate insulating film 410 can be prevented, and oxidation of the surface of the source electrode layer 406a under the oxide semiconductor film 408 can be prevented. Employing ashing treatment to remove the resist mask 430 can prevent damage (e.g., contamination by impurities, thickness reduction, or oxygen vacancies) to the surface of the oxide semiconductor film 408 due to chemical liquid treatment in peeling the resist mask. Note that by the ashing treatment performed here, an oxide film 431 is formed on a surface of the conductive film 412 in some cases.

Next, with the use of the conductive film 412 having the opening portion 417 as a mask, the oxide semiconductor film 408 is etched. By this etching step, the opening portion 415 overlapping with the opening portion 417 and reaching the source electrode layer 406a is formed in the oxide semiconductor film 408.

Figure 3D:
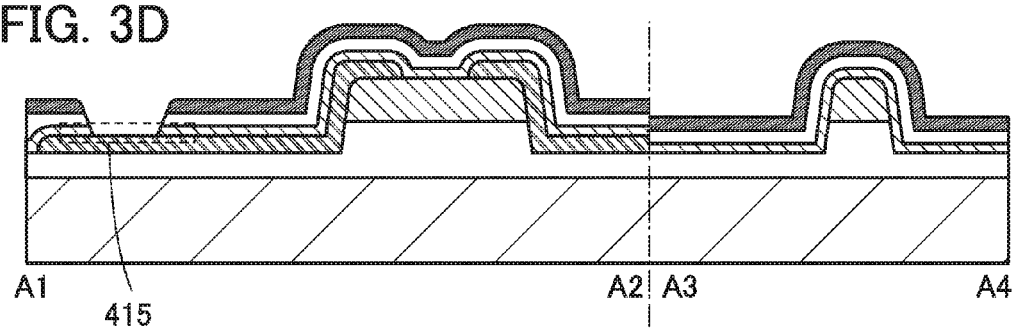

Reverse sputtering treatment is performed on the conductive film 412 to remove the oxide film 431 formed on the surface of the conductive film 412 (see FIG. 3D). The reverse sputtering treatment refers to a method in which, without application of voltage to a target side, an power source is used for application of voltage to a substrate side in an inert gas (e.g., argon) atmosphere to generate plasma in the vicinity of the substrate to modify a surface. The reverse sputtering treatment also planarizes a surface where a conductive film 414 is to be formed later.

Figure 4A:
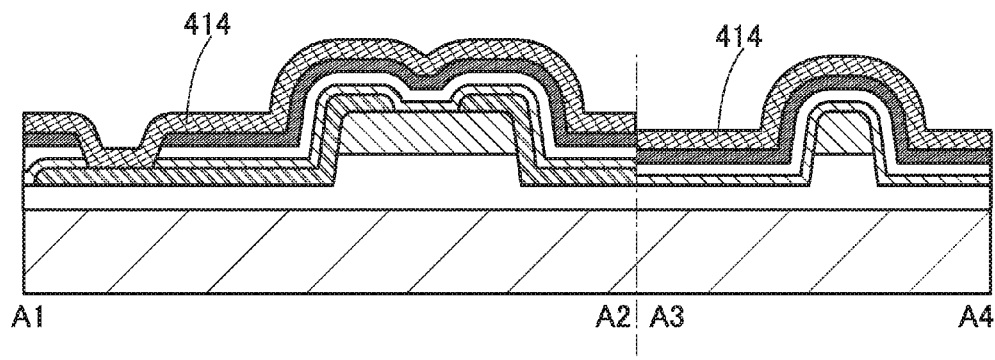
FIGS. 4A to 4C are cross-sectional views illustrating a method for manufacturing a semiconductor device.

Then, the conductive film 414 is formed over the conductive film 412 to be in contact with the source electrode layer 406a that is exposed in the opening portion 415 and the opening portion 417 (see FIG. 4A). The conductive film 414 may be formed by a sputtering method, a CVD method, an MBE method, an ALD method, or a PLD method. In this embodiment, a tungsten film is formed as the conductive film 414.

Figure 4B:
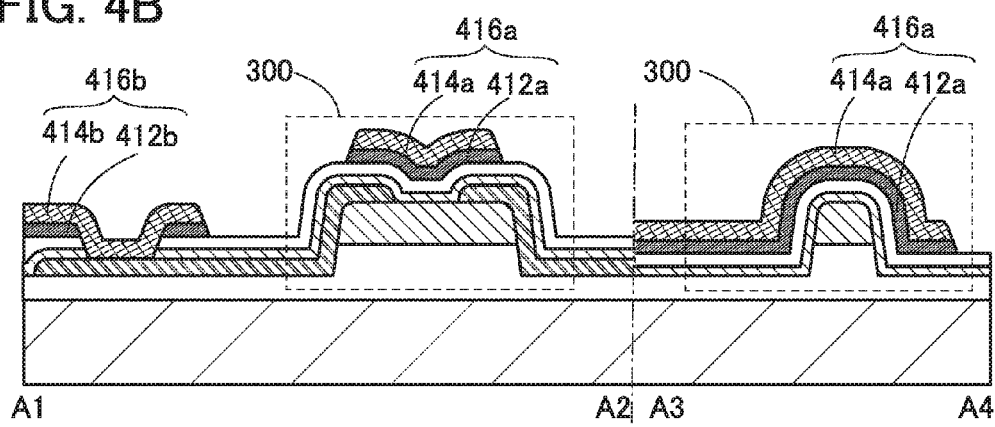
Figure 4C:
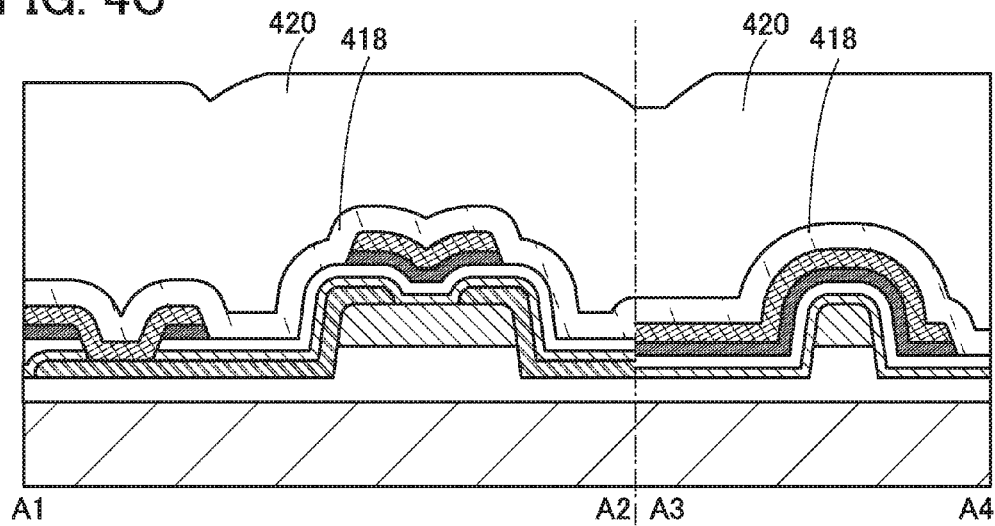

After that, the conductive film 412 and the conductive film 414 are processed by etching using photolithography, so that the gate electrode layer 416a including the first conductive layer 412a and the second conductive layer 414a and the electrode layer 416b including the first conductive layer 412b and the second conductive layer 414b are formed (see FIG. 4B). By the etching treatment, the transistor 300 and the electrode layer 416b electrically connected to the source electrode layer 406a of the transistor 300 are formed.

Then, the protective insulating film 418 is formed over the transistor 300 and the electrode layer 416b. Furthermore, the insulating film 420 is formed over the protective insulating film 418 (see FIG. 4C).

As described above, as the protective insulating film 418, an insulating film having a lower permeability to oxygen (higher barrier property against oxygen) than the oxide semiconductor film 408 and the gate insulating film 410 is provided. As the protective insulating film 418, an aluminum oxide film, a silicon nitride film, or a silicon nitride oxide film can be provided, for example. Note that the protective insulating film 418 is preferably formed by a sputtering method because it is preferable to reduce the concentration of hydrogen in the protective insulating film 418.

For example, in the case of forming an aluminum oxide film as the protective insulating film 418, the aluminum oxide film may be formed using a sputtering target including aluminum oxide or may be formed using an aluminum target in an oxygen atmosphere or an atmosphere of oxygen and a rare gas.

The insulating film 420 is stacked over the protective insulating film 418, whereby the withstand voltage of the transistor 300 can be increased. The insulating film 420 can be formed using an inorganic insulating material, and the thickness of the insulating film 420 is preferably larger than at least the thickness of the protective insulating film 418. For example, as the insulating film 420, a 300-nm-thick silicon oxynitride film can be formed by a plasma CVD method.

It is preferable to perform heat treatment after the protective insulating film 418 and the insulating film 420 are formed. The temperature of the heat treatment is preferably higher than or equal to 300° C. and lower than or equal to 450° C. By the heat treatment, oxygen is easily released from the base insulating film 402, so that oxygen vacancies in the oxide semiconductor layer 404 can be reduced.

In the case where the conductive film to be the source electrode layer 406a and the drain electrode layer 406b is formed by a sputtering method, the surface of the oxide semiconductor layer 404 might be damaged by plasma at the time of the deposition and an oxygen vacancy might be formed. Further, hydrogen might occupy the formed oxygen vacancy. Thus, after the conductive film to be the source electrode layer 406a and the drain electrode layer 406b is formed, the whole surface of the oxide semiconductor layer 404 which is in contact with the conductive film might have n-type conductivity. These problems can be effectively solved by the following process in which the oxide semiconductor film 408 is formed in contact with an n-type region of the oxide semiconductor layer 404; the protective insulating film 418 that prevents release of oxygen is formed over the oxide semiconductor film 408; and then the heat treatment for supplying oxygen is performed. The supply of oxygen to the oxide semiconductor layer 404 by the heat treatment enables an n-type region where a channel is formed to change into an i-type region.

Furthermore, the temperature and time of the heat treatment are adjusted as appropriate; consequently, the regions having n-type conductivity owing to the oxygen vacancies remain in regions in contact with the source electrode layer 406a and the drain electrode layer 406b, and at the same time, the i-type region where a channel is formed can be formed. In this case, the oxide semiconductor layer 404 can include the n-type regions that function as a source region and a drain region and a channel region that is intrinsic or substantially intrinsic.

In this manner, the semiconductor device in this embodiment can be manufactured.

<Structure Example 3 of Semiconductor Device>

Figure 5:
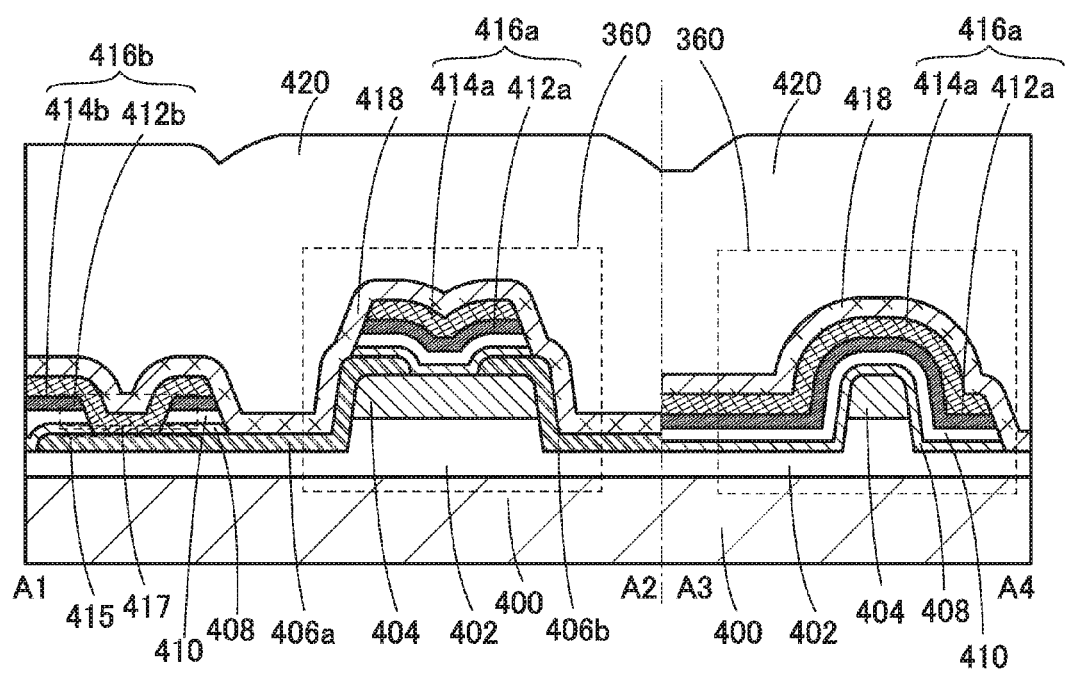
FIG. 5 is a cross-sectional view illustrating one mode of a semiconductor device.

FIG. 5 illustrates a structure example of a semiconductor device that includes a transistor 360. The semiconductor device in FIG. 5 is different from the above-described semiconductor devices in that the oxide semiconductor film 408 and the gate insulating film 410 are processed in a self-aligned manner with the use of the gate electrode layer 416a and the electrode layer 416b as masks. Because the oxide semiconductor film 408 and the gate insulating film 410 are processed in a self-aligned manner, the structure in FIG. 5 can be formed. without making the number of masks larger than that in the above-described method for manufacturing the semiconductor device. When the structure in FIG. 5 is employed, side surfaces of the oxide semiconductor film 408 and the gate insulating film 410 can be covered with the protective insulating film 418, which can prevent release of oxygen from the side surfaces and/or entry of impurities such as hydrogen. When the structure illustrated in FIGS. 1A and 1B is employed, the planarity of a surface where the protective insulating film 418 is formed can be improved, which can increase the coverage with the protective insulating film 418 and the insulating film 420 provided over the protective insulating film 418.

As described above, in the semiconductor having the structure described in this embodiment, the electrode layers over and under the oxide semiconductor layer can be stably connected through the opening portion provided in the oxide semiconductor layer. The semiconductor device having the structure in this embodiment is a high-reliability semiconductor device in which shape defects and poor connection are inhibited.

The structures, the methods, and. the like described in this embodiment can be combined as appropriate with any of the structures, the methods, and the like described in the other embodiments.

(Embodiment 2)

A structure of an oxide semiconductor layer which can be used as the oxide semiconductor layer 404 in the semiconductor device of one embodiment of the present invention is described below.

An oxide semiconductor layer is classified roughly into a single-crystal oxide semiconductor layer and a non-single-crystal oxide semiconductor layer. The non-single-crystal oxide semiconductor layer includes a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First, a CAAC-OS layer is described.

The CAAC-OS layer is one of oxide semiconductor layers including a plurality of crystal parts, and most of the crystal parts each fit inside a cube whose one side is less than 100 nm. Thus, there is a case where a crystal part included in the CAAC-OS layer fits inside a cube whose one side is less than 10 nm, less than 5 nm, or less than 3 nm.

In a transmission electron microscope (TEM) image of the CAAC-OS layer, it is difficult to observe clearly a boundary between crystal parts, that is, a grain boundary. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a shape reflecting unevenness of a surface over which the CAAC-OS layer is formed (hereinafter, a surface over which the CAAC-OS layer is formed is referred to as a formation surface) or a top surface of the CAAC-OS layer, and is arranged parallel to the formation surface or the top surface of the CAAC-OS layer.

On the other hand, according to the TEM image of the CAAC-OS layer observed in a direction substantially perpendicular to the sample surface (plan-view TEM image), metal atoms are arranged in a triangular or hexagonal configuration in the crystal parts, However, there is no regularity of arrangement of metal atoms between different crystal parts.

From the results of the cross-sectional TEM image and the plan-view TEM image, alignment is found in the crystal parts in the CAAC-OS layer.

A CAAC-OS layer is subjected to structural analysis with an X-ray diffraction (XRD) apparatus. For example, when the CAAC-OS layer including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor layer of $InGaZnO_4$, six peaks appear. The six peaks are derived from crystal planes equivalent to the (110) plane. On the other hand, in the case of a CAAC-OS layer, a peak is not clearly observed even when $\phi$ scan is performed with $2\theta$ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Furthermore, the degree of crystallinity in the CAAC-OS layer is not necessarily uniform. For example, in the case where crystal growth leading to the CAAC-OS layer occurs from the vicinity of the top surface of the layer, the degree of the crystallinity in the vicinity of the top surface is higher than that in the vicinity of the formation surface in some cases. Furthermore, when an impurity is added to the CAAC-OS layer, the crystallinity in a region to which the impurity is added is changed, and the degree of crystallinity in the CAAC-OS layer varies depending on regions.

Note that when the CAAC-OS layer with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS layer. It is preferable that in the CAAC-OS layer, a peak of $2\theta$ appear at around 31° and a peak of $2\theta$ not appear at around 36°.

The CAAC-OS layer is an oxide semiconductor layer with low impurity concentration. The impurity means an element other than the main components of the oxide semiconductor layer, such as hydrogen, carbon, silicon, or a transition metal element. In particular, an element (e.g., silicon) which has higher bonding strength with oxygen than a metal element included in the oxide semiconductor layer causes disorder of atomic arrangement in the oxide semiconductor layer because the element deprives the oxide semiconductor layer of oxygen, thereby reducing crystallinity. Furthermore, a heavy metal such as iron or nickel, argon, carbon dioxide, and the like have a large atomic radius (or molecular radius); therefore, when any of such elements is contained in the oxide semiconductor layer, the element causes disorder of the atomic arrangement of the oxide semiconductor layer, thereby reducing crystallinity. Note that the impurity contained in the oxide semiconductor layer might become a carrier trap or a carrier generation source.

The CAAC-OS layer is an oxide semiconductor layer with a low density of defect states. For example, oxygen vacancies in the oxide semiconductor layer serve as carrier traps or serve as carrier generation sources when hydrogen is trapped therein.

The state in which impurity concentration is low and density of defect states is low (the number of oxygen vacancies is small) is referred to as "highly purified intrinsic" or "substantially highly purified intrinsic". A highly-purified intrinsic or substantially highly-purified intrinsic oxide semiconductor layer has few carrier generation sources, and thus can have a low carrier density. Thus, a transistor using the oxide semiconductor layer rarely has a negative threshold voltage (rarely has normally-on characteristics). A highly-purified intrinsic or substantially highly-purified intrinsic oxide semiconductor layer has few carrier traps. Accordingly, the transistor using the oxide semiconductor layer has a small change in electrical characteristics and high reliability. Note that charges trapped in the carrier traps in the oxide semiconductor layer take a long time to be released and may behave like fixed charges. Thus, the transistor using the oxide semiconductor layer with a high impurity concentration and a high density of defect states has unstable electrical characteristics in some cases.

In a transistor using the CAAC-OS layer, change in electrical characteristics due to irradiation with visible light or ultraviolet light is small.

Next, a microcrystalline oxide semiconductor layer is described.

In an image obtained with a TEM, crystal parts cannot be found easily and clearly in the microcrystalline oxide semiconductor layer in some cases. in most cases, the size of a crystal part included in the microcrystalline oxide semiconductor layer is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In an image of the nc-OS layer obtained with a TEM, for example, a crystal grain boundary is not observed easily and clearly in some cases.

In the nc-OS layer, a microscopic region (e.g., a region with a size greater than or equal to 1 nm and less than or equal to 10 nm, in particular, a region with a size greater than or equal to 1. nm and less than or equal to 3 nm) has a periodic atomic order. The nc-OS layer does not have regularity of crystal orientation between different crystal parts. Thus, the orientation of the whole film is not observed. Accordingly, in some cases, the nc-OS layer cannot be distinguished from an amorphous oxide semiconductor layer depending on an analysis method. For example, when the nc-OS layer is subjected to structural analysis by an out-of-plane method with an XRD) apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS layer obtained by using an electron beam having a probe diameter (e.g., larger than or equal to 50 nm) larger than the diameter of a crystal part. Meanwhile, spots are shown in a nanobeam electron diffraction pattern of the nc-OS layer obtained by using an electron beam having a probe diameter (e.g., larger than or equal to 1 nm and smaller than or equal to 30 nm) close to, or smaller than the diameter of a crystal part.

Furthermore, in a nanobeam electron diffraction pattern of the nc-OS layer, regions with high luminance in a circular (ring) pattern are shown in some cases. Also in a nanobeam electron diffraction pattern of the nc-OS layer, a plurality of spots are shown in a ring-like region in some cases.

Since the nc-OS layer is an oxide semiconductor layer having more regularity than the amorphous oxide semiconductor layer, the nc-OS layer has a lower density of defect states than the amorphous oxide semiconductor layer. However, there is no regularity of crystal orientation between different crystal parts in the nc-OS layer; hence, the nc-OS layer has a higher density of defect states than the CAAC-OS layer.

Note that an oxide semiconductor layer may be a stacked film including two or more layers of an amorphous oxide semiconductor layer, a microcrystalline oxide semiconductor layer, and a CAAC-OS layer, for example. The oxide semiconductor film 408 provided in contact with the oxide semiconductor layer 404 can have a structure similar to that of the above-described oxide semiconductor layer.

The structures, the methods, and the like described in this embodiment can be combined as appropriate with any of the structures, the methods, and the like described in the other embodiments.

(Embodiment 3)

In this embodiment, as an example of the semiconductor device described in Embodiment 1, a semiconductor device (semiconductor memory device) which can retain stored data even when not powered and which has an unlimited number of write cycles is described with reference to drawings.

Figure 6A:
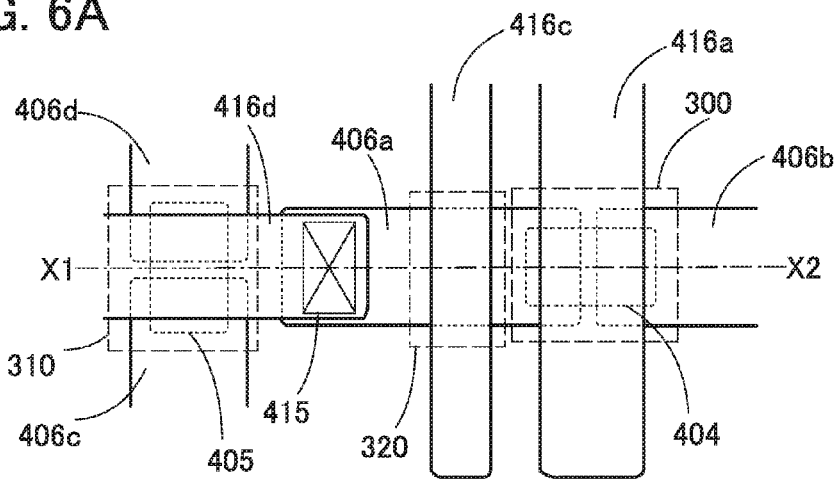
FIGS. 6A to 6C are a plan view, a cross-sectional view, and a circuit diagram illustrating one mode of a semiconductor device.
Figure 6B:
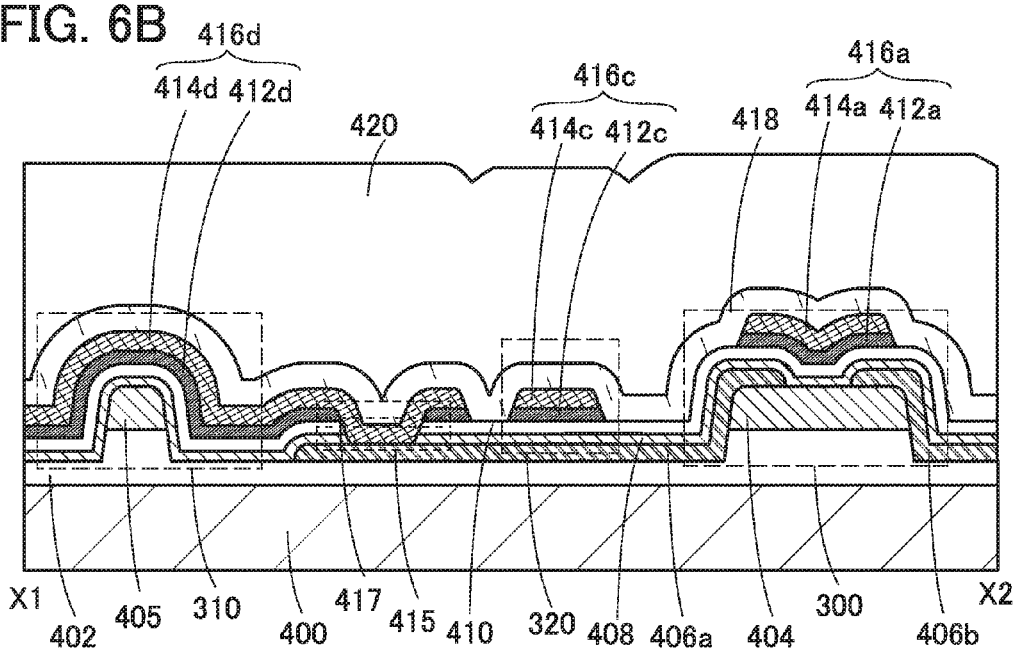
Figure 6C:
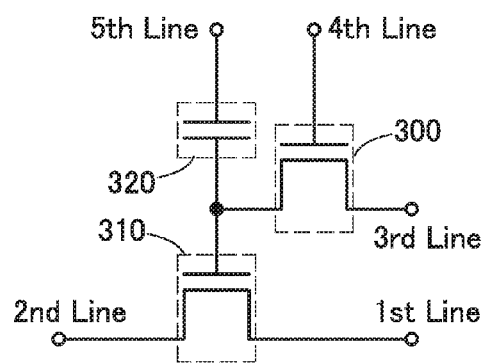

FIGS. 6A to 6C illustrate one example of a structure of the semiconductor device. FIG. 6A is a plan view of the semiconductor device, FIG. 6B is a cross-sectional view taken along line X1-Y1 in FIG. 6A, and FIG. 6C is a circuit diagram of the semiconductor device.

The semiconductor device of this embodiment illustrated in FIGS. 6A and 6B includes the transistor 300, a transistor 310 adjacent to the transistor 300, and a capacitor 320. The transistor 300 has the same structure as the transistor 300 described in Embodiment 1. The transistor 310 is manufactured by the same steps as the transistor 300 and includes an island-like oxide semiconductor layer 405 formed over the substrate 400 with the base insulating film 402 provided therebetween; a source electrode layer 406c and a drain electrode layer 406d electrically connected to the oxide semiconductor layer 405 the oxide semiconductor film 408 over the source electrode layer 406c and the drain electrode layer 406d; the gate insulating film 410 over the oxide semiconductor film 408; and a gate electrode layer 416d overlapping; with the island-like oxide semiconductor layer 405 with the gate insulating film 410 provided therebetween. The gate electrode layer 416d includes a first conductive layer 412d and a second conductive layer 414d, which are stacked in this order. Note that the transistor 300 and the transistor 310 have; the oxide semiconductor film 408 and the gate insulating film 410 in common.

The gate electrode layer 416d of the transistor 310 has a region in contact with the source electrode layer 406a of the transistor 300 and corresponds to the electrode layer 416b in Embodiment 1. Specifically; the first conductive layer 412d of the gate electrode layer 416d and the gate insulating film 410 have the opening portion 417 in a position overlapping with the source electrode layer 406a of the transistor 300, and the oxide semiconductor film 408 has the opening portion 415 overlapping with the opening portion 417. The second conductive layer 414d of the gate electrode layer 416d is formed to be in contact with the source electrode layer 406a exposed in the opening portion 417 and the opening portion 415. This structure enables electrical connection between the source electrode layer 406a of the transistor 300 and the gate electrode layer 416d of the transistor 310.

The source electrode layer 406a of the transistor 300 serves as one electrode of the capacitor 320. The other electrode 416c of the capacitor 320 has a stacked-layer structure of a first conductive layer 412c and a second conductive layer 414c and is formed by the same steps as the gate electrode layer 416a of the transistor 300 and the gate electrode layer 416d of the transistor 310. Note that in the case where a capacitor is not needed, the capacitor 320 may be omitted. Alternatively, the capacitor 320 may be separately provided above the transistor 300.

The transistor 300 illustrated in FIG. 6A includes an oxide semiconductor in a channel formation region. The transistor including, an oxide semiconductor in a channel formation region can achieve extremely low a off-state current. Since the off-state current of the transistor 300 is small, by using the transistor 300 in a semiconductor memory device, stored data can be retained for a long period. in other words, refresh operation becomes unnecessary or the frequency of the refresh operation in a semiconductor memory device can be extremely low, which leads to a sufficient reduction in power consumption. Note that the oxide semiconductor layer included in the transistor 300 is preferably highly purified. By using a highly purified oxide semiconductor, the transistor 300 can have more favorable off-state characteristics.

An example of a circuit configuration corresponding to FIGS. 6A and 6B is illustrated in FIG. 6C.

In FIG. 6C, a first wiring (1st Line) is electrically connected to the source electrode layer of the transistor 310. A second wiring (2nd Line) is electrically connected to the drain electrode layer of the transistor 310. A third wiring (3rd Line) is electrically connected to one of the source electrode layer and the drain electrode layer of the transistor 300, and a fourth wiring (4th Line) is electrically connected to the gate electrode layer of the transistor 300. The gate electrode layer of the transistor 310 and the other of the source electrode layer and the drain electrode layer of the transistor 300 are electrically connected to the one electrode of the capacitor 320. A fifth wiring (5th Line) is electrically connected to the other electrode of the capacitor 320.

The semiconductor device in FIG. 6C utilizes a characteristic in which the potential of the gate electrode layer of the transistor 310 can beheld, and thus enables writing, storing, and reading of data as follows.

Writing and storing of data are described. First, the potential of the fourth wiring is set to a potential at which the transistor 300 is turned, on, so that the transistor 300 is turned on. Accordingly, the potential of the third wiring is supplied to the gate electrode layer of the transistor 310 and the capacitor 320. That is, a predetermined charge is supplied to the gate electrode layer of the transistor 310 (writing). Here, one of two kinds of charges providing different potential levels (hereinafter referred to as a low-level charge and a high-level charge) is supplied. After that, the potential of the fourth wiring is set to a potential at which the transistor 300 is turned off, so that the transistor 300 is turned off. Thus, the charge supplied to the gate electrode layer of the transistor 310 is held (holding).

Since the off state current of the transistor 300 is extremely small, the charge of the gate electrode layer of the transistor 310 is held for a long time.

Next, reading of data is described. By supplying an appropriate potential (a reading potential) to the fifth wiring while supplying a predetermined potential (a constant potential) to the first wiring, the potential of the second wiring varies depending on the amount of charge held in the gate electrode .layer of the transistor 310. This is because in general, when the transistor 310 is an n-channel transistor, an apparent threshold voltage $V_{th\_H}$ in the case where the high-level charge is given to the gate electrode layer of the transistor 310 is lower than an apparent threshold voltage $V_{th\_L}$ in the case where the low-level charge is given to the gate electrode layer of the transistor 310. Here, an apparent threshold voltage refers to the potential of the fifth wiring which is needed to turn on the transistor 310. Thus, the potential of the fifth wiring is set to a potential $V_0$ which is between $V_{th\_H}$ and $V_{th\_L}$, whereby charge supplied to the gate electrode layer of the transistor 310 can be determined. For example, in the case where the high-level charge is supplied in writing, when the potential of the fifth wiring is $V_0$ ($>V_{th\_H}$), the transistor 310 is turned on. In the case where the low-level charge is supplied in writing, even when the potential of the fifth wiring is $V_0$ ($<V_{th\_L}$), the transistor 310 remains off. Therefore, the stored data can be read by the potential of the second wiring.

Note that in the case where memory cells are arrayed, it is necessary that only data of a desired memory cell be able to be read. In the memory cell where data is not read, the fifth wiring may be supplied with a potential at which the transistor 310 is turned off regardless of the state of the gate electrode layer, that is, a potential smaller than $V_{th\_H}$. Alternatively, the fifth wiring may be supplied with a potential at which the transistor 310 is turned on regardless of the state of the gate electrode layer, that is, a potential higher than $V_{th\_L}$.

When including a transistor having a channel formation region formed using an oxide semiconductor and having an extremely small off-state current, the semiconductor device described in this embodiment can retain stored data for an extremely long period. In other words, refresh operation becomes unnecessary or the frequency of the refresh operation can be extremely low, which leads to a sufficient reduction in power consumption. Moreover, stored data can be retained for a long period even when power is not supplied (note that a potential is preferably fixed). Further, when a normally-off transistor is used as the transistor 300, and power is not supplied, a ground potential may be input to the gate (the gate electrode layer 416*a*) of the transistor 300. With that structure, the transistor 300 can remain off and stored data can be kept on being retained even when power is not supplied.

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, data is written depending on the on state and the off state of the transistor, whereby high-speed operation can be easily achieved.

In the semiconductor device described in this embodiment, connection between the electrodes of the adjacent transistors is established by the manufacturing method described in Embodiment 1; thus, the semiconductor device can have a minute structure and high reliability.

As described above, a miniaturized and highly integrated semiconductor device having high electrical characteristics and a method for manufacturing the semiconductor device can be provided.

The structures, the methods, and the like described in this embodiment can be combined as appropriate with any of the structures, the methods, and the like described in the other embodiments.

(Embodiment 4)

In this embodiment, an RFIC tag that includes the transistor described in the above embodiments or the semiconductor memory device described in the above embodiment is described with reference to FIG. 7.

The RFIC tag of this embodiment includes a memory circuit, stores necessary data in the memory circuit, and transmits and receives data to/from the outside by using contactless means, for example, wireless communication. With these features, the RFIC tag can be used for an individual authentication system in which an object or the like is recognized by reading the individual information, for example. Note that the RFIC tag is required to have extremely high reliability in order to be used for this purpose.

Figure 7:
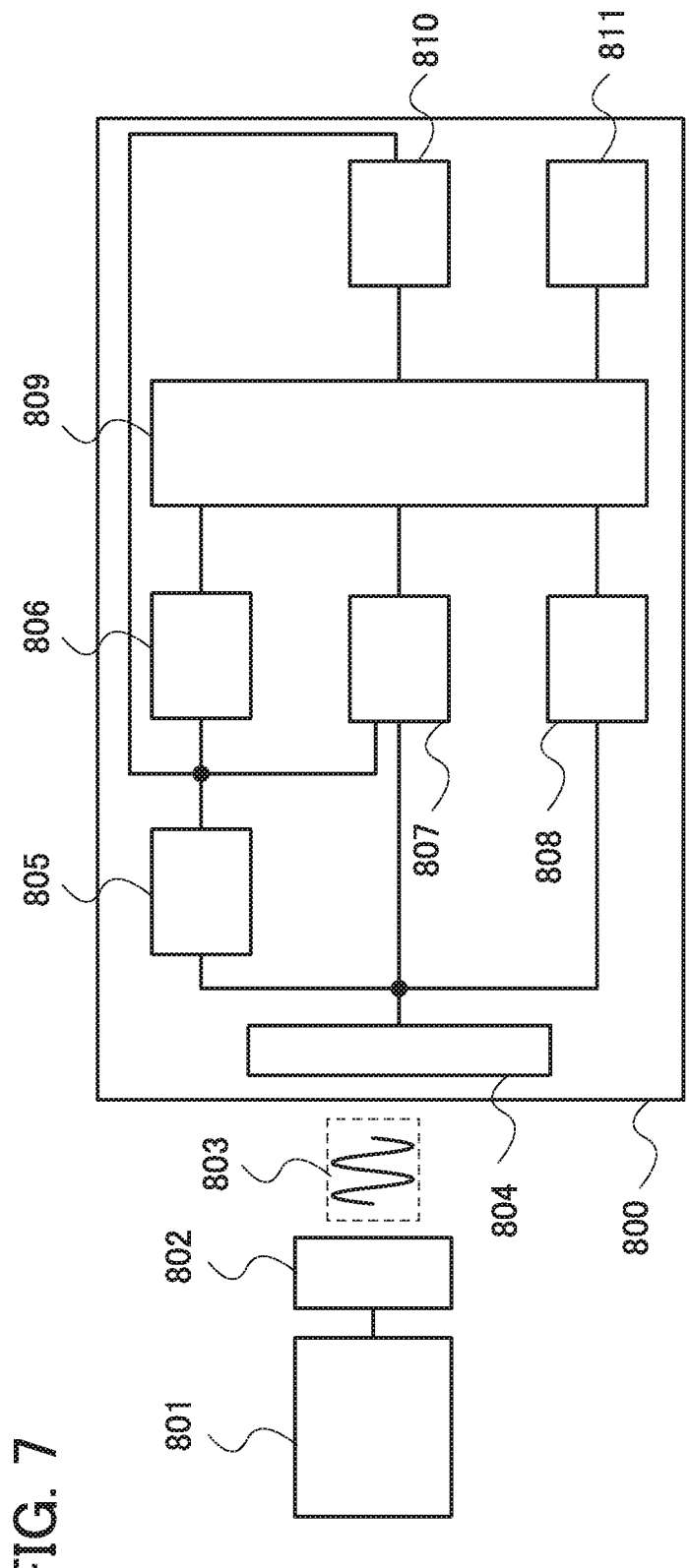
FIG. 7 illustrates a structure example of an RFIC tag of one embodiment.

A configuration of the RFIC tag will be described with reference to FIG. 7 FIG. 7 is a block diagram illustrating a configuration example of an RFIC tag.

As shown in FIG. 7, an RFIC tag 800 includes an antenna 804 which receives a radio signal 803 that is transmitted from an antenna 802 connected to a communication device 801 (also referred to as an interrogator, a reader/writer, or the like). The RFIC tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFIC tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the semiconductor memory device described in the above embodiment can be used as the memory circuit 810. Since the semiconductor memory device of one embodiment of the present invention can retain data even when not powered, the semiconductor memory device can be favorably used for an RFIC tag. Furthermore, the semiconductor memory device of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the semiconductor memory device of one embodiment of the present invention can be used as a nonvolatile memory, it can also be used as the. ROM 811. In this case, it is preferable that a manufacturer separately prepare a command for writing data to the ROM 811 so that a user cannot rewrite data, freely, Since the manufacturer gives identification numbers before shipment and then starts shipment of products, instead of putting identification numbers to all the manufactured RFIC tags, it is possible to put identification numbers to only good products to be shipped. Thus, the identification numbers of the shipped products are in series and customer management corresponding to the shipped products is easily performed.

The structures, the methods, and the like described in this embodiment can be combined as appropriate with any of the structures, the methods, and the like described in the other embodiments.

(Embodiment 5)

In this embodiment, a CPU in which at least the transistor described in any of the above embodiments can be used and the semiconductor memory device described in the above embodiment is included is described.

Figure 8:
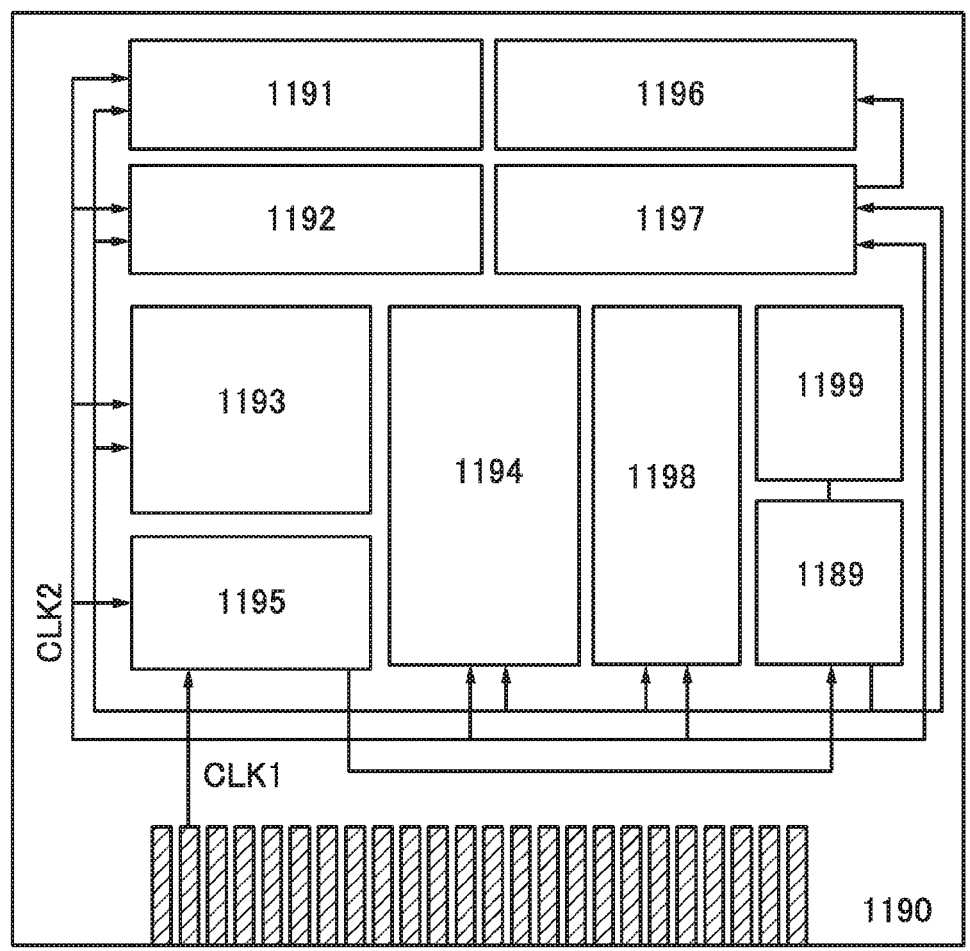
FIG. 8 illustrates a structure example of a CPU of one embodiment.

FIG. 8 is a block diagram illustrating a configuration example of a CPU at least partly including an of the transistors described in the above embodiments as a component.

The CPU illustrated in FIG. 8 includes, over a substrate 1190, an arithmetic logic unit (AUL) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 8 is just an example in which the configuration has been simplified, and an actual CPU may have a variety of configurations depending on the application. For example, the CPU may have the following configuration: a structure including the CPU illustrated in FIG. 8 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU. The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 8, a memory cell is provided in the register 1196. For the memory cell of the register 1196, any of the transistors described in the above embodiments can be used.

In the CPU illustrated in FIG. 8, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be slopped.

Figure 9:
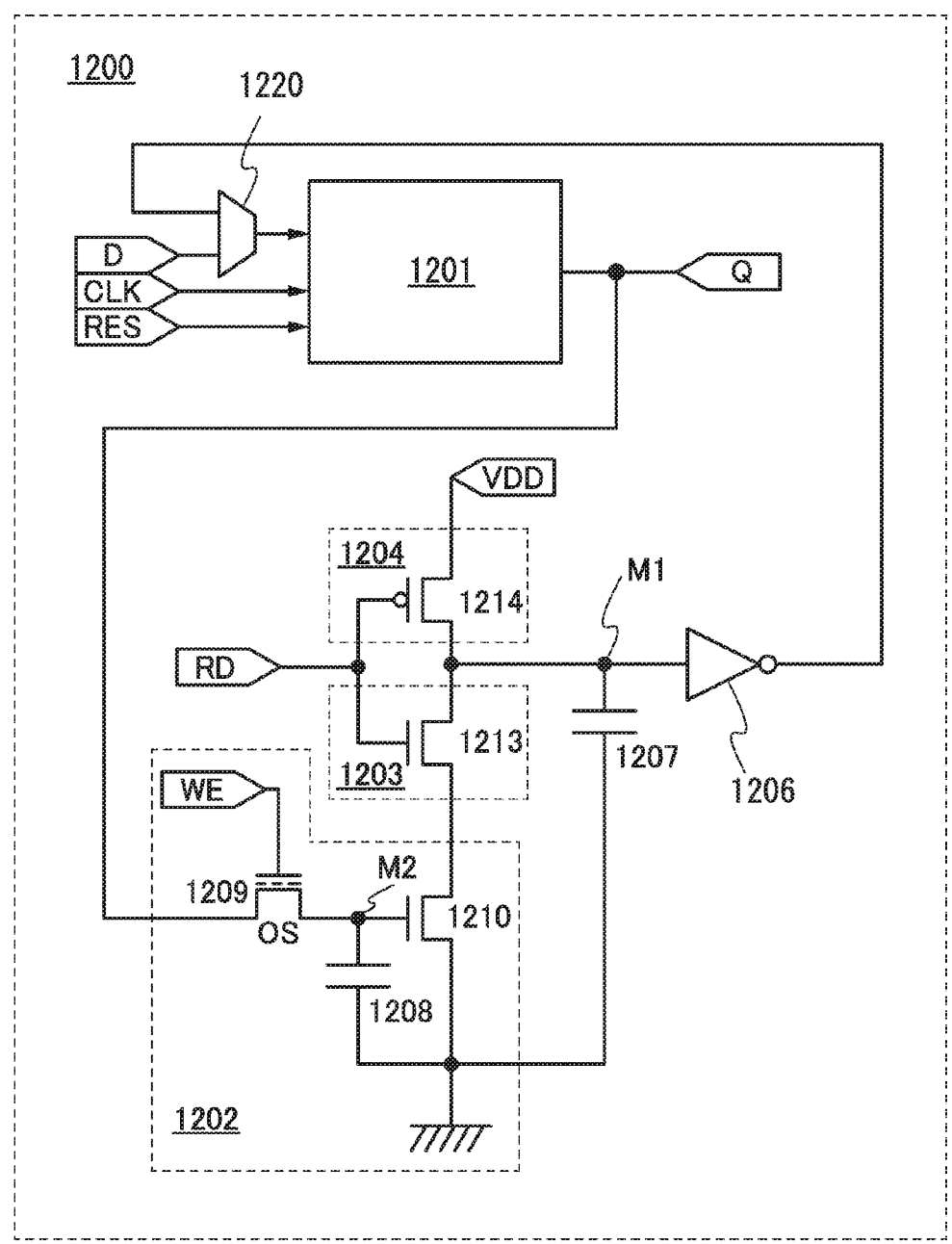
FIG. 9 is a circuit diagram of a memory element of one embodiment.

FIG. 9 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203 a switch 1204, a logic element 1206, a capacitor 1207, and a circuit 1220 having a selecting function. The circuit 1202 includes a capacitor 1208. a transistor 1209, and a transistor 1210. Note that the memory element 1200 may further include another element such as a diode, a resistor, or an inductor, as needed.

Here, the semiconductor memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and. the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal. of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1 The other of the pair of electrodes of the capacitor 1207 can be supplied with a constant potential. For example, the other of the pair of electrodes of the capacitor 1207 can be supplied with. a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction. state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 9 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 9, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output front the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 9, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 9, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period. during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained. by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned. to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

The structures, the methods, and the like described in this embodiment can be combined as appropriate with any of the structures, the methods, and the like described in the other embodiments.

(Embodiment 6)

In this embodiment, a structure example of a display panel of one embodiment of the present invention is described.

[Structure Example]

Figure 14A:
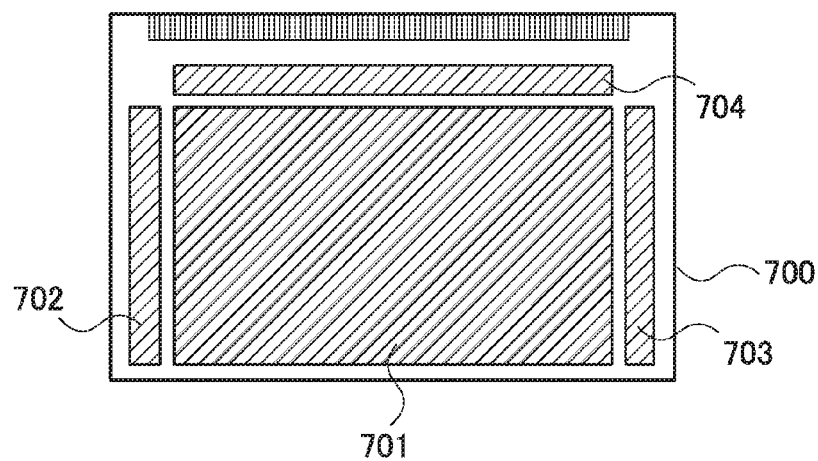
FIGS. 14E to 14C are a block diagram and circuit diagrams of a display device of one embodiment.
Figure 14B:
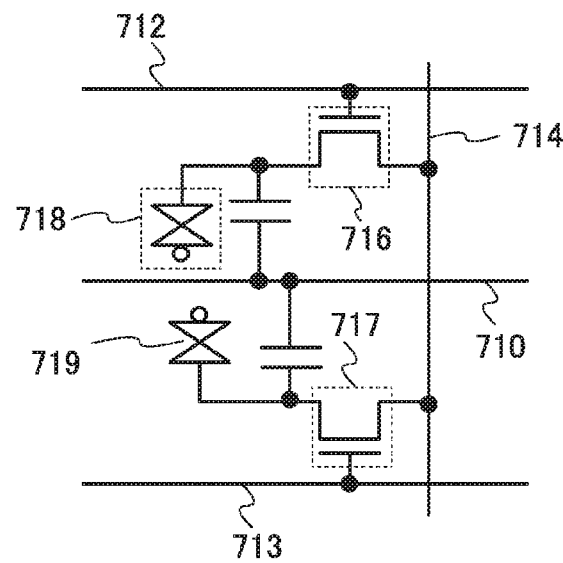
Figure 14C:
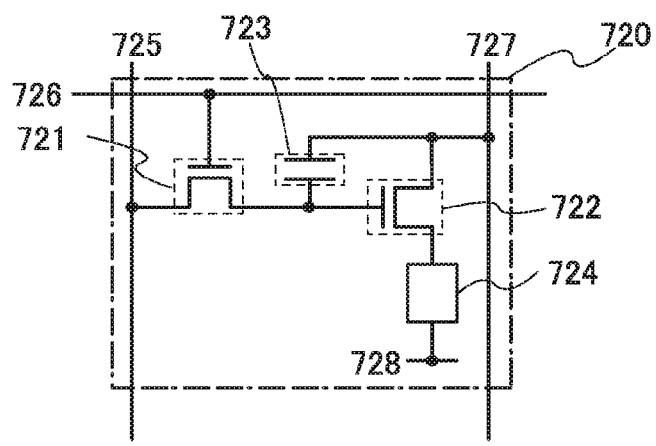

FIG. 14A is a top view of the display panel of one embodiment of the present invention. FIG. 14B is a circuit diagram illustrating a pixel circuit that can be used in the case where a liquid crystal element is used in a pixel in the display panel of one embodiment of the present invention. FIG. 14C is a circuit diagram illustrating a pixel circuit that can be used in the case where an organic EL element is used in a pixel in the display panel of one embodiment of the present invention.

The transistor in the pixel portion can be formed in accordance with the above embodiments. Further, the transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 14A illustrates an example of a block diagram of an active matrix display device. A pixel portion 701. a first scan line driver circuit 702, a second scan line driver circuit 703, and a signal line driver circuit 704 are provided over a substrate 700 in the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels that include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 14A, the first scan line driver circuit 702, the second scan line driver circuit 703, and the signal line driver circuit 704 are formed over the same substrate 700 as the pixel portion 701. Accordingly, the number of components that are provided. outside, such as a driver circuit, is reduced, so that a reduction in coat can be achieved. Further, in the case where the driver circuit is provided outside the substrate 700, wirings would need to be extended and the number of connections of wirings would be increased. When the driver circuit is provided over the substrate 700, the number of connections of the wirings can be reduced. Consequently, an improvement in reliability or yield can be achieved.

<Liquid Crystal Panel>

FIG. 14B illustrates an example of a circuit configuration of the pixel, Here, a pixel circuit that can be used in a pixel of a VA liquid crystal display panel is illustrated.

This pixel circuit can be used in a structure in which one pixel. includes a plurality of pixel electrode layers. The pixel electrode layers are connected to different transistors, and the transistors can be driven with different gate signals. Accordingly; signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode 714 functioning, as a data line is shared by the transistors 716 and 717. Any of the transistors described in the above embodiments can be used as appropriate as each of the transistors 716 and 717. Thus, a highly reliable liquid crystal display panel can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 14B, For example, a switch, a resistor, a capacitor, a transistor, a sensor, a logic circuit, or the like may be added to the pixel illustrated in FIG. 14B.

<Organic EL Panel>

FIG. 14C illustrates another example of a circuit configuration of the pixel Here, a pixel structure of a display panel using an organic EL. element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 14C illustrates an applicable example of a pixel circuit. Here, one pixel includes two n-channel. transistors.

Note that the oxide semiconductor film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and. a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, any of the transistors described in the above embodiments can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 indicates a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer. Next, a signal input to the driver transistor 722 is described. In the case of a voltage-input voltage driving method, a video signal for turning on or off the driver transistor 722 without fail is input to the driver transistor 722.

in order for the driver transistor 722 to operate in a linear region, voltage higher than the voltage of the power supply line 727 is applied to the gate electrode layer of the driver transistor 722. Note that voltage higher than or equal to voltage that is the sum of power supply line voltage and the threshold voltage Vth of the driver transistor 722 is applied to the signal line 725.

In the case of performing analog gray-scale driving, a voltage greater than or equal to a voltage that is the sum of the forward voltage of the light-emitting element 724 and the threshold voltage Vth of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 14C. For example, a switch, a resistor, a capacitor, a sensor, a transistor, a logic circuit, or the like may be added to the pixel circuit illustrated in FIG. 14C.

In the case where the transistor shown in the above embodiments is used for the circuit shown in FIGS. 14A to 14C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

The structures, the methods, and the like described in this embodiment can be combined as appropriate with any of the structures, the methods, and the like described in the other embodiments.

(Embodiment 7)

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 10A to 10F illustrate specific examples of these electronic devices.

Figure 10A:
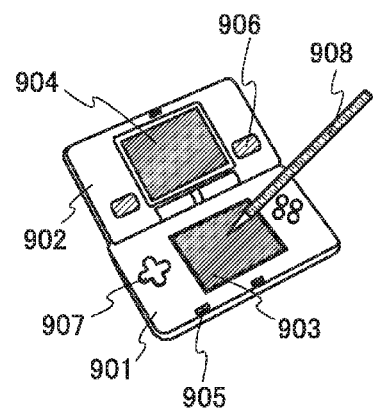
FIGS. 10A to 10F each illustrate an electronic device of one embodiment.

FIG. 10A illustrates a portable game console including a housing 901, a housing 902, a display portion 903, a display portion 904, a microphone 905, a speaker 906, an operation key 907, a stylus 908, and the like. Although the portable game machine in FIG. 10A has the two display portions 903 and 904, the number of display portions included in a portable game machine is not limited to this.

Figure 10B:
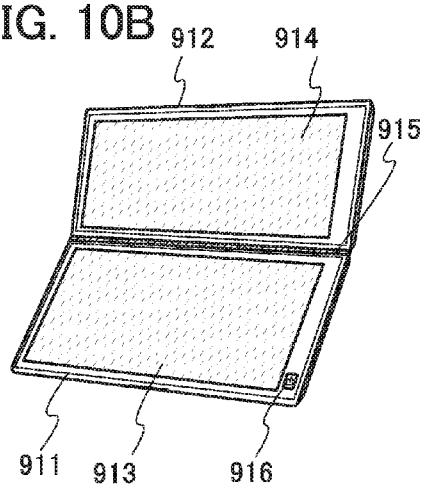

FIG. 10B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 10C:
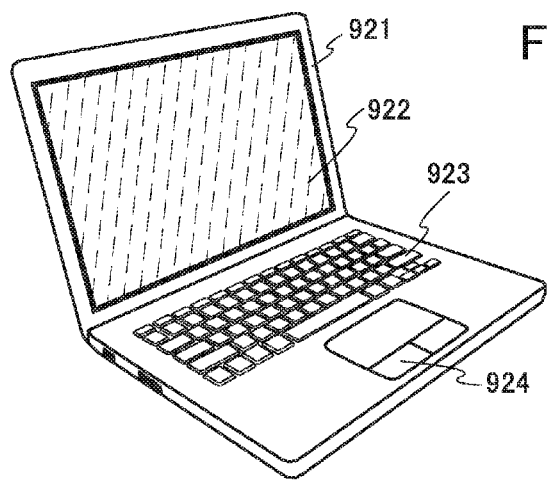

FIG. 10C illustrates a laptop personal computer, which includes a housing 921, a display portion 922, a keyboard 923, a pointing device 924, and the like.

Figure 10D:
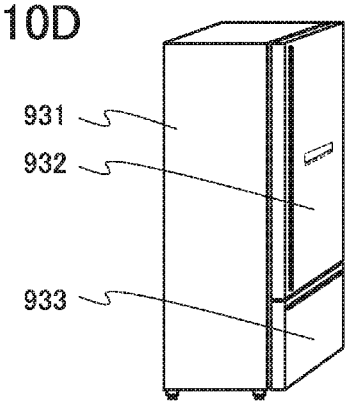

FIG. 10D illustrates an electric refrigerator-freezer including a housing 931, a door for a refrigerator 932, a door for a freezer 933, and the like.

Figure 10E:
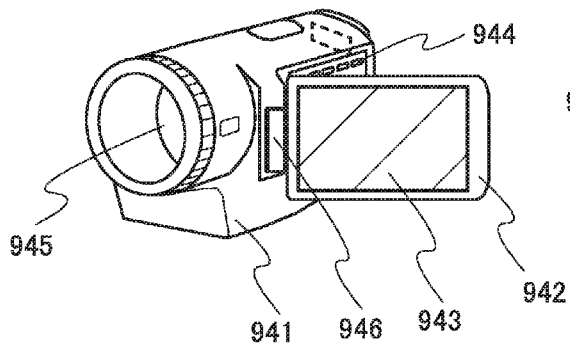

FIG. 10E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 10F:
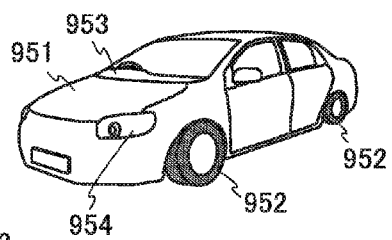
Figure 11A:
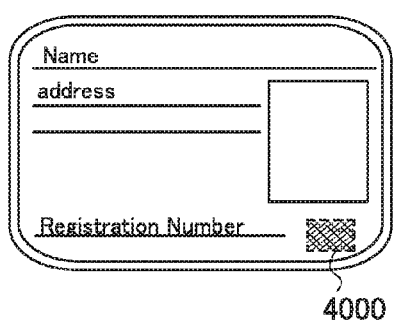
FIGS. 11A to 11F each illustrate an application example of an RFIC of one embodiment.
Figure 11B:
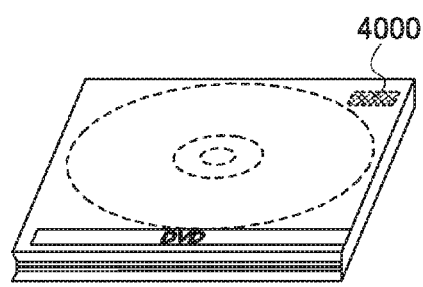
Figure 11C:
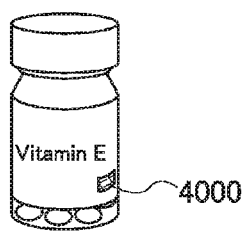
Figure 11D:
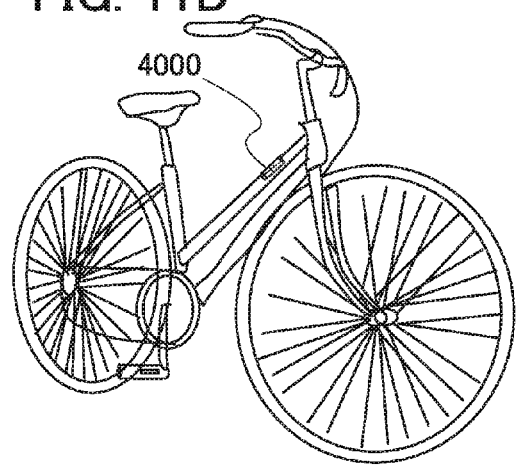
Figure 11E:
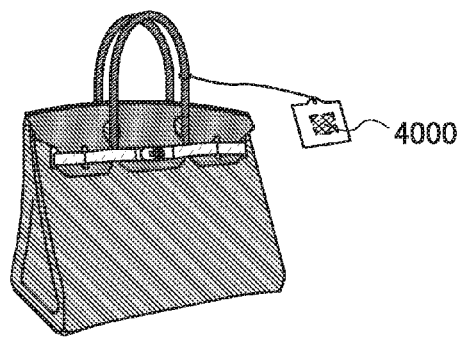
Figure 11F:
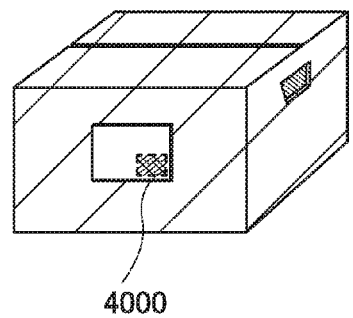

FIG. 10F illustrates an ordinary vehicle including a car body 951, wheels 952, a dashboard 953, lights 954, and the like.

The structures, the methods, and the like described in this embodiment can be combined as appropriate with any of the structures, the methods, and the like described in the other embodiments.

(Embodiment 8)

In this embodiment, application examples of an RFIC of one embodiment of the present invention will be described with reference to FIGS. 11A to 11F. The RFIC is widely used and can be provided for, for example, objects such as bills, coins, securities, bearer bonds, documents (e.g., driver's licenses or resident's cards, see FIG. 11A), packaging containers (e.g., wrapping paper or bottles, see FIG. 11C), recording media (e.g., DVD software or video tapes, see FIG. 11B), vehicles (e.g., bicycles, see FIG. 11D), personal belongings (e.g., bags or glasses), foods, plants, animals, human bodies, clothing, household goods, medical supplies such as medicine and chemicals, and electronic devices (e.g., liquid crystal display devices, EL display devices, television sets, or mobile phones), or tags on objects (see FIGS. 11F and 11F).

An RFIC 4000 of one embodiment of the present invention is fixed to an object by being attached to a surface thereof or embedded therein. For example, the RFIC 4000 is fixed to each object by being embedded in paper of a book, or embedded in an organic resin of a package. Since the RFIC 4000 of one embodiment of the present invention can be reduced in size, thickness, and weight, it can be fixed to an object without spoiling the design of the object. Furthermore, bills, coins, securities, bearer bonds, documents, or the like can have an identification function by being provided with the RFIC 4000 of one embodiment of the present invention, and the identification function can be utilized to prevent counterfeiting. Moreover, the efficiency of a system such as an inspection system can be improved by providing the RFIC of one embodiment of the present invention for packaging containers, recording media, personal belongings, foods, clothing, household goods, electronic devices, or the like. Vehicles can also have higher security against theft or the like by being provided with the RFIC of one embodiment of the present invention.

As described above, by using the RFIC of one embodiment of the present invention for each application described in this embodiment, power for operation such. as writing or reading of data can be reduced, which results in an increase in the maximum communication distance. Moreover, data can be held for an extremely long period even in the state where power is not supplied; thus, the RFIC can be preferably used for application in which data is not frequently written or read.

The structures, the methods, and the like described in this embodiment can be combined as appropriate with any of the structures, the methods, and the like described in the other embodiments.

[Example]

In this example, a cross-sectional structure of an electrode layer formed by the formation method of one embodiment of the present invention is described together with comparative examples. First, methods for manufacturing a sample 1 and comparative samples 1 to 3 in this example are described below.

<Sample 1>

Over a silicon substrate, a 10-nm-thick tungsten film was formed as a conductive film to be a first electrode layer 206, by a sputtering method. The deposition conditions of the tungsten film were set as follows: an argon atmosphere (flow rate: 80 sccm) was used; the pressure was 0.8 Pa the electric power (DC) was 1 kW; the substrate temperature was 200° C.; and the distance between the substrate and the target was 60 mm.

Next, as an oxide semiconductor film 208, a 5-nm-thick In—Ga—Zn oxide film was formed over the first electrode layer 206 by a sputtering method using an oxide target with an atomic ratio of In:Ga:Zn=1:3:2. Deposition conditions were as follows: the atmosphere was argon and oxygen (argon: oxygen=30 sccm: 15 sccm); the pressure, 0.4 Pa; the electric power (DC), 0.5 kW; the substrate temperature, 200° C.; and the distance between the substrate and the target, 60 mm.

Then, as an insulating film 210 corresponding to a gate insulating film, a 10-nm-thick oxynitride film was formed over the oxide semiconductor film 208 by a CVD method. The deposition temperature was 350° C. and the pressure was 200 Pa.

Over the insulating film 210, a 10-nm-thick tantalum nitride film was formed as a first conductive film 212 by a sputtering method. Deposition conditions of the tantalum nitride film were as follows: the atmosphere was argon and nitrogen (argon: nitrogen=50 sccm: 10 sccm); the pressure, 0.6 Pa; the electric power (pc), 1 kW; the substrate temperature, room. temperature; and the distance between the substrate and the target, 60 mm.

After that, over the first conductive film 212, an organic coating film having a thickness of approximately 20 nm and a resist film having a thickness of approximately 100 nm were formed by a coating method. Subsequently, exposure was performed on the resist film by scanning of an electron beam, and development treatment was performed, so that the resist film was patterned to be a resist mask.

Then, the organic coating film, the first conductive film 212 (tantalum nitride film), and the insulating film 210 (silicon oxynitride film) were etched with. the use of the resist mask, whereby an opening portion reaching the oxide semiconductor film 208 was formed. Etching conditions were as follows: the etching gas was tetrafluoromethane (flow rate: 100 sccm); the electric power, 2 kW; the bias power, 50 W; and the pressure, 0.67 Pa.

Next, ashing treatment using plasma was performed in an oxygen atmosphere to remove the organic coating film and the resist mask. The conditions of the ashing treatment were as follows: the flow rate of oxygen was 100 sccm, the RF bias power was 200 W, the pressure was 500 mTorr, and the ashing treatment time was 30 seconds.

After that, the oxide semiconductor film 208 was etched with the use of the first conductive film 212 having the opening portion as a mask, so that an opening portion reaching the first electrode layer 206 was formed. In the etching, first, a mixed gas of tetrafluoromethane and argon ($CF_4$: Ar=16 sccm: 32 sccm) was used as the etching gas, the electric power was 600 W, the bias power was 100 W, the pressure was 3.0 Pa, and the etching treatment time was 3 seconds; then, the pressure was reduced to 1.0 Pa and the etching treatment was continued for 20 seconds.

Next, an oxide film that was formed on a surface of the first conductive film 212 because of the above ashing treatment was removed by reverse sputtering treatment. The conditions of the reverse sputtering treatment were as follows: the atmosphere was argon (flow rate: 50 sccm); the pressure, 0.6 Pa; the electric power (RF), 200 W; and the treatment time, 45 seconds.

Then, to be in contact with the first electrode layer 206 exposed in the opening portion of the oxide semiconductor film 208, a 10-nm-thick tungsten film as a second conductive film 214 was formed over the first conductive film 212 by a sputtering method. The deposition conditions of the tungsten film were set as follows: an argon atmosphere (flow rate: 100 sccm) was used; the pressure was 2.0 Pa; the electric power (DC) was 1 kW:, the substrate temperature was 200° C; and the distance between the substrate and. the target was 60 mm.

Through the above manufacturing process, the sample 1 of this example was fabricated.

<Comparative sample 1>

In the comparative sample 1, an opening portion was formed by one etching step in the oxide semiconductor film 208 and the insulating film 210 that were formed. by the same methods as those used for the sample 1; a resist mask was removed by ashing treatment; and the first conductive film 212 and the second conductive film 214 covering the opening portion were formed. The manufacturing method is described in detail below.

By the same methods as those used for the sample 1 the first electrode layer 206 was formed over a silicon substrate, the oxide semiconductor film 208 was formed over the first electrode layer 206, and the insulating film 210 was formed over the oxide semiconductor film 208, After that, over the insulating film 210, an organic coating film and a resist mask were formed in manners similar to those of the sample 1.

Next, the organic coating film, the insulating film 210 (silicon oxynitride film), and the oxide semiconductor film 208 were etched with the use of a resist mask, whereby an opening portion reaching the first electrode layer 206 was formed. Specifically, first, the organic coating film was etched under the following conditions: the etching gas was tetrafluoromethane (flow rate: 100 sccm); the electric power was 2 kW; the bias power was 50 W; the pressure was 0.67 Pa; the substrate temperature was −10° C., and the treatment time was 12 seconds. Then, etching of the insulating film 210 and the oxide semiconductor film 208 was performed in which, first, the etching gas was a mixed gas of trifluoromethane and helium ($CHF_3$: He=50 sccm: 100 sccm), the electric power was 475 W, the bias power was 300 W, the pressure was 5.5 Pa, and the treatment time was 3 seconds; then, the flow rate ratio of the etching gases was changed to CHF$_3$:He 7.5 sccm: 142.5 sccm and the etching treatment was continued for 16 seconds.

Next, ashing treatment using plasma was performed in an oxygen atmosphere to remove the organic coating film and the resist mask. The conditions of the ashing treatment were as follows: the flow rate of oxygen was 300 sccm, the RF power was 1800 W, the pressure was 66.5 Pa, and the ashing treatment time was 3 minutes.

After that, as the first conductive film 212 covering the opening portion, a tantalum nitride film was formed over the insulating film 210. A tungsten. film was formed as the second conductive film 214 over the tantalum nitride film. The deposition conditions of the first conductive film 212 and the second conductive film 214 are the same as those used for the sample 1.

Through the above manufacturing process, the comparative sample 1 of this example was fabricated.

<Comparative Sample 2>

In the case of the comparative sample 2, an opening portion reaching the first electrode layer 206 was formed in the insulating film 210 and the oxide semiconductor film 208 by the same process as that used for the comparative sample 1 then, ashing treatment and treatment using a chemical liquid (stripper) were performed to remove an organic coating film and a resist mask.

In the case of the comparative sample 2, the organic coating film and the resist mask were removed by performing ashing treatment under the same conditions as those used for the comparative sample 1 and then performing the treatment using the stripper.

In the case of the comparative sample 2, steps other than the step of removing the organic resin film and the resist mask were performed in manners similar to those of the comparative sample 1. Through the above manufacturing process, the comparative sample 2 of this example was fabricated.

<Comparative Sample 3>

In the case of the comparative sample 3, by the same method as that used for the sample 1, the oxide semiconductor film 208 was etched using the first conductive film 212 as a mask, whereby an opening portion reaching the first electrode layer 206 was formed; then, a step of removing an oxide film on the surface of the first conductive film 712 by reverse sputtering treatment was skipped and the second conductive film 214 was formed.

The method for fabricating the comparative sample 3 was the same as that used for the sample 1 except for the absence of the reverse sputtering treatment. Through the above manufacturing process, the comparative sample 3 of this example was fabricated.

A cross-sectional structure of a connection portion between the first electrode layer 206 and the second electrode layer including the first conductive film 212 and the second conductive film 214 in each of the sample I and the comparative samples 1 to 3 that were obtained in the above manners was observed using a scanning transmission electron microscope (STEM). The STEM images are shown in FIGS. 12A to 12D. FIGS. 12A, 12B, 12C, and 12D are the cross-sectional STEM images of the comparative sample 1, the comparative sample 2, the comparative sample 3, and the sample 1, respectively.

Figure 12A:
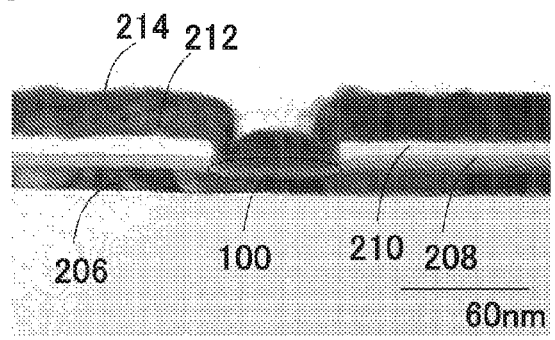
FIGS. 12A to 12D are cross-sectional STEM images of samples manufactured in Example.

It was found from FIG. 12A. that a minute opening portion with a diameter of approximately 60 nm was formed in the comparative sample 1 and that the first conductive film 212 and the second conductive film 214 filled the opening portion.

However, it was also observed that an oxide layer was formed between the first electrode layer 206 and the first conductive film 212, as can be seen in a region 100 circled with a dotted line in FIG. 12A. The oxide layer was presumably formed by oxidation of the first electrode layer 206 exposed in the opening portion at the time of the ashing treatment of the organic coating film and the resist mask.

Figure 12B:
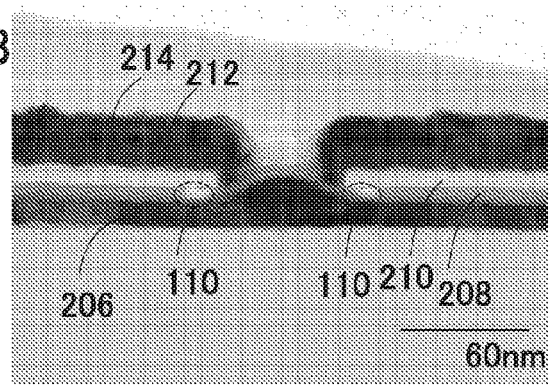

In the comparative sample 2, whose fabrication involved the use of the stripper at the time of removal of the resist mask, a shape defect of the oxide semiconductor film 208 (region 110 facing the opening portion was observed as can be seen in FIG. 12B. It is understood that this is because the oxide semiconductor film 208 was damaged by being exposed to the stripper.

Figure 12C:
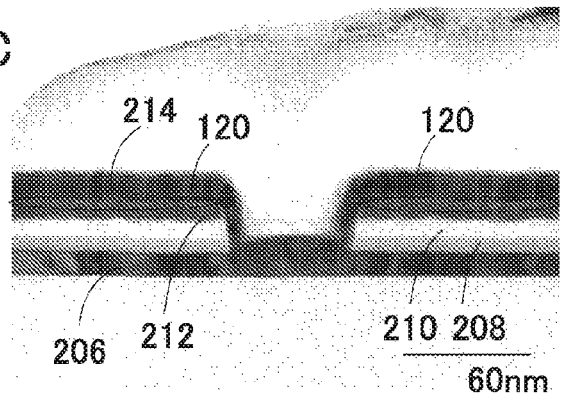

It was found from FIG. 12C that a minute opening portion with a diameter of approximately 60 nm was formed in the comparative sample 3, whose fabrication did not involve reverse sputtering treatment, and that the first electrode layer 206 and the second conductive film 214 were in contact with each other in the opening portion. However, it was also observed that an oxide layer was formed between the first conductive film 212 and the second conductive film 214 as can be seen in the region 100 circled with a dotted line in FIG. 12G. The oxide layer was presumably formed by oxidation of the surface of the first conductive film 212 at the time of the ashing treatment of the organic coating film and the resist mask.

Figure 12D:
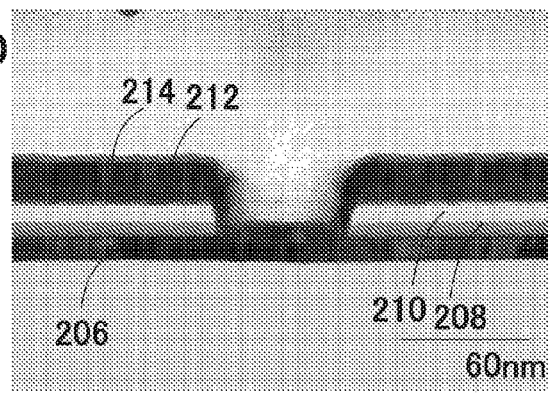

FIG. 12D shows that in the sample 1 of this example, a minute opening portion with a diameter of approximately 60 nm was formed, the first electrode layer 206 and the second conductive film 214 were in contact with each other in the opening portion, and the first conductive film 212 and the second conductive film 214 were in contact with each other over the insulating film 210. In other words, it was shown that in the sample 1 obtained by the manufacturing method of one embodiment of the present invention, good connection can be established between the electrode layers over and under the oxide semiconductor film 208. Furthermore., in the sample 1 of this example, the ashing treatment for removing the resist mask was performed in a state where the oxide semiconductor film 208 was exposed in the opening portion; thus, oxidation of a surface of the first electrode layer 206 and plasma damage to the insulating film 210 can be inhibited.

The structures, the methods, and the like described in this example can be combined as appropriate with any of the structures, the methods, and the like described in the embodiments in this specification.

This application is based on Japanese Patent Application serial no. 2013-184096 filed with Japan Patent Office on Sep., 5, 2013, the entire contents of which are hereby incorporated by reference.

What is claimed is:

1. A method for manufacturing a semiconductor device comprising the steps of:
   sequentially forming an oxide semiconductor film, an insulating film, and a first conductive film over an electrode layer over a substrate;
   forming a resist mask over the first conductive film;
   etching a part of the first conductive film and a part of the insulating film by using the resist mask to form a first opening portion reaching the oxide semiconductor film in a position overlapping with the electrode layer;
   removing the resist mask;
   etching a part of the oxide semiconductor film by using the first conductive film comprising the first opening portion as a mask, to form a second opening portion reaching the electrode layer; and forming a second conductive film over the first conductive film, wherein the second conductive film is in contact with the electrode layer exposed in the first opening portion and the second opening portion.

2. The method for manufacturing the semiconductor device according to claim 1, wherein the resist mask is removed by ashing treatment using oxygen plasma.

3. The method for manufacturing the semiconductor device according to claim 2, wherein after the resist mask is removed and before the second conductive film is formed, the ashing treatment using the oxygen plasma is performed to remove an oxide film formed on a surface of the first conductive film.

4. A method for manufacturing a semiconductor device comprising the steps of:

forming an insulating layer over a substrate;
forming an oxide layer over the insulating layer;
forming a first electrode layer over the oxide layer;
sequentially forming an oxide semiconductor film, an insulating film, and a first conductive film over the first electrode layer;
forming a resist mask over the first conductive film;
etching a part of the first conductive film and a part of the insulating film by using the resist mask to form a first opening portion reaching the oxide semiconductor film in a position overlapping with the first electrode layer;
removing the resist mask;
etching a part of the oxide semiconductor film by using the first conductive film comprising the first opening portion as a mask, to form an oxide semiconductor layer comprising a second opening portion reaching the first electrode layer; and
forming a second conductive film over the first conductive film, wherein the second conductive film is in contact with the first electrode layer exposed in the first opening portion and the second opening portion.

5. The method for manufacturing the semiconductor device according to claim 4, further comprising the step of:
etching the first conductive film comprising the first opening portion and the second conductive film to form a second electrode layer and a third electrode layer.

6. The method for manufacturing the semiconductor device according to claim 5,
wherein the second electrode layer comprises a stacked-layer structure of a first part of the first conductive film and a first part of the second conductive film, and
wherein the first part of the second conductive film is in contact with the first electrode layer.

7. The method for manufacturing the semiconductor device according to claim 5,
wherein the third electrode layer comprises a stacked-layer structure of a second part of the first conductive film and a second part of the second conductive film, and
wherein the oxide semiconductor layer is sandwiched between the third electrode layer and the oxide layer.

8. The method for manufacturing the semiconductor device according to claim 7, wherein the third electrode layer is a gate electrode layer.

9. The method for manufacturing the semiconductor device according to claim 4, wherein the first electrode layer is a source electrode layer or a drain electrode layer.

10. The method for manufacturing the semiconductor device according to claim 4, wherein the oxide layer comprises an oxide semiconductor material.

11. The method for manufacturing the semiconductor device according to claim 4, wherein the resist mask is removed by ashing treatment using oxygen plasma.

12. The method for manufacturing the semiconductor device according to claim 11, wherein after the resist mask is removed and before the second conductive film is formed, the ashing treatment using the oxygen plasma is performed to remove an oxide film formed on a surface of the first conductive film.

* * * * *